United States Patent
Khalili et al.

(10) Patent No.: US 10,135,448 B1
(45) Date of Patent: Nov. 20, 2018

(54) PHASE-LOCKED LOOP (PLL) WITH CHARGE SCALING

(71) Applicant: Qualcomm Incorporated, San Diego, CA (US)

(72) Inventors: Alireza Khalili, Sunnyvale, CA (US); Amir Ziabasharhagh, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/710,751

(22) Filed: Sep. 20, 2017

(51) Int. Cl.
H03L 7/06 (2006.01)
H03L 7/08 (2006.01)
H03L 7/089 (2006.01)
H03L 7/093 (2006.01)

(52) U.S. Cl.
CPC ............ H03L 7/0895 (2013.01); H03L 7/093 (2013.01)

(58) Field of Classification Search
CPC .............................. H03L 7/0895; H03L 7/093
See application file for complete search history.

(56) References Cited

U.S. PATENT DOCUMENTS

| | | | |
|---|---|---|---|
| 5,831,484 A | 11/1998 | Lukes et al. | |
| 6,385,265 B1 | 5/2002 | Duffy et al. | |
| 6,642,759 B1 | 11/2003 | Hughes | |
| 7,659,760 B2 * | 2/2010 | Doi | H03L 7/0895 327/147 |
| 8,525,564 B2 | 9/2013 | Schober et al. | |
| 8,773,184 B1 | 7/2014 | Petrov et al. | |
| 9,024,667 B1 * | 5/2015 | Fu | H03L 1/00 327/148 |
| 2011/0215847 A1 * | 9/2011 | Al-Shahrani | H03L 7/08 327/157 |
| 2014/0266343 A1 * | 9/2014 | Song | H03L 7/0802 327/157 |
| 2017/0310328 A1 * | 10/2017 | Ishibashi | H03L 7/0891 |

* cited by examiner

*Primary Examiner* — Kenneth B Wells
(74) *Attorney, Agent, or Firm* — Colby Nipper/Qualcomm

(57) ABSTRACT

An integrated circuit is disclosed that implements a phase-locked loop with charge scaling. In an example aspect, the integrated circuit includes a charge pump, a filter, and a charge manager. The charge pump generates a current signal, and the filter includes a filter capacitor. The charge manager is coupled between the charge pump and the filter. The charge manager includes current-sampling capacitance circuitry and a charge manager controller that is coupled to the current-sampling capacitance circuitry. The current-sampling capacitance circuitry receives the current signal from the charge pump and retains charge from the current signal to create stored charge, with the stored charge including a first charge portion and a second charge portion. The charge manager controller causes the current-sampling capacitance circuitry to communicate the first charge portion to the filter capacitor and causes the current-sampling capacitance circuitry to divert the second charge portion away from the filter capacitor.

30 Claims, 12 Drawing Sheets

PHASE-LOCKED LOOP (PLL) WITH CHARGE SCALING

TECHNICAL FIELD

This disclosure relates generally to electronic communications and, more specifically, to facilitating the use of communication signals having different frequencies with a phase-locked loop (PLL) that implements charge scaling.

BACKGROUND

Electronic devices include traditional computing devices such as desktop computers, notebook computers, smartphones, wearable devices like a smartwatch, internet servers, and the like. However, electronic devices also include other types of computing devices such as personal voice assistants, thermostats, automotive electronics, robotics, devices embedded in other machines like refrigerators and industrial tools, Internet-of-Things (IoTs) devices, and so forth. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among distributed electronic devices using wireless or wired signals that are transmitted over one or more networks, such as the Internet or a cellular network. Electronic communications can also include those exchanged between or among different printed circuit boards, modules, chips, or cores of a given integrated circuit within a single electronic device. Regardless, electronic communications are usually accomplished by generating or propagating signals. Typically, such electronic communications are performed using at least one signal that is designed to have a specified frequency. Generally, communication signals are more likely to be correctly transmitted and received, as well as accurately interpreted, if the specified frequency is accurately created and reliably maintained.

A phase-locked loop (PLL) is often used to create, or synthesize, a desired frequency. In fact, a phase-locked loop is typically a core part of a frequency synthesizer, which is a component that is employed by electronic devices to synthesize signals having different frequencies. In operation, a phase-locked loop receives a reference signal and applies the reference signal to a feedback loop. Using the feedback loop, the circuitry of the phase-locked loop generates an output signal that oscillates at a desired frequency in a stable and accurate manner. Typically, the phase-locked loop derives the frequency of the oscillating output signal from the reference signal, such as by being some multiple of the reference signal.

A PLL-based frequency synthesizer thus outputs an oscillating signal having some desired frequency. The electronic device then uses the synthesized frequency of the output signal in one or more stages of a communication scenario. Example stages for communicating an electromagnetic signal include generating, transmitting, receiving, or interpreting a communication signal. For an example signal generation stage, a frequency generated by a phase-locked loop can be used to modulate a communication signal. Here, the modulation entails adding information—such as a text and an associated photograph—to the communication signal. For an example signal transmission stage, the frequency generated by a phase-locked loop can be employed to upconvert a frequency of a communication signal using a mixer. With an up-conversion operation, the mixer increases the frequency of the communication signal, such as to enable the communication signal to be transmitted wirelessly as a radio frequency (RF) signal. A phase-locked loop can also be used on the receiving side of a typical communication scenario. For instance, a phase-locked loop can be used to down-convert a frequency of a received communication signal or to demodulate the received communication signal to recover the encoded information, such as the text message with the associated photograph.

Thus, phase-locked loops are employed in multiple stages of a communication scenario to support electronic communications with electronic devices. Consequently, electrical engineers and other designers of electronic devices strive to improve the functionality and usability of phase-locked loops to facilitate electronic communications with electronic devices.

SUMMARY

A phase-locked loop (PLL) that uses charge scaling is disclosed herein. Example implementations of the disclosed phase-locked loop can occupy a smaller footprint on an integrated circuit chip while being used to facilitate modulating a communication signal with information, upconverting a frequency of a communication signal to be transmitted, down-converting a frequency of a received communication signal, demodulating a down-converted communication signal to recover information, and so forth.

In an example aspect, an integrated circuit is disclosed. The integrated circuit includes a charge pump, a filter, and a charge manager. The charge pump is configured to generate a current signal; the filter includes a filter capacitor. The charge manager is coupled between the charge pump and the filter. The charge manager includes current-sampling capacitance circuitry and a charge manager controller. The current-sampling capacitance circuitry is configured to receive the current signal from the charge pump and retain charge from the current signal to create stored charge, with the stored charge including a first charge portion and a second charge portion. The charge manager controller is coupled to the current-sampling capacitance circuitry. The charge manager controller is configured to cause the current-sampling capacitance circuitry to communicate the first charge portion to the filter capacitor and to cause the current-sampling capacitance circuitry to divert the second charge portion away from the filter capacitor.

In an example aspect, an integrated circuit is disclosed. The integrated circuit includes a charge pump, a filter having a filter capacitor, and a charge manager coupled between the charge pump and the filter capacitor of the filter. The charge pump is configured to generate a current signal that provides a charge. The filter is configured to provide a voltage signal to a voltage-controlled oscillator based on a voltage level associated with the filter capacitor. The charge manager includes control means for controlling the voltage level associated with the filter capacitor based on a first charge portion of the charge provided by the current signal. The charge manager also includes diversion means for diverting away from the filter capacitor a second charge portion of the charge provided by the current signal.

In an example aspect, a method for operating a phase-locked loop is disclosed. The method includes connecting a first capacitor and a second capacitor to a current source. The method also includes charging the first capacitor and the second capacitor using charge provided by the current source. The method additionally includes disconnecting the first capacitor and the second capacitor from the current source. The method further includes connecting the first capacitor to a filter capacitor and discharging the first capacitor responsive to the connecting of the first capacitor to the filter capacitor. The method still further includes discharging the second capacitor away from the filter capacitor.

In an example aspect, a phase-locked loop is disclosed. The phase-locked loop includes a charge pump, a filter, and a charge manager that is coupled between the charge pump and the filter. The charge pump includes a down current source, and the filter includes a filter capacitor. The charge manager includes a down control capacitor and a down diversion capacitor. The charge manager also includes at least one first down control switch coupled in series with the down control capacitor between the down current source and an equipotential node. The charge manager additionally includes at least one second down control switch coupled in series with the down control capacitor between the filter capacitor and the equipotential node. The charge manager further includes at least one first down diversion switch coupled in series with the down diversion capacitor between the down current source and the equipotential node. The charge manager still further includes at least one second down diversion switch coupled in series with the down diversion capacitor between a diversion terminal and the equipotential node. In another example aspect, the phase-locked loop can also include analogous up components, such as an up current source, an up control capacitor, an up diversion capacitor, at least one first up control switch, at least one second up control switch, at least one first up diversion switch, and at least one second up diversion switch.

DETAILED DESCRIPTION

Figure 1:
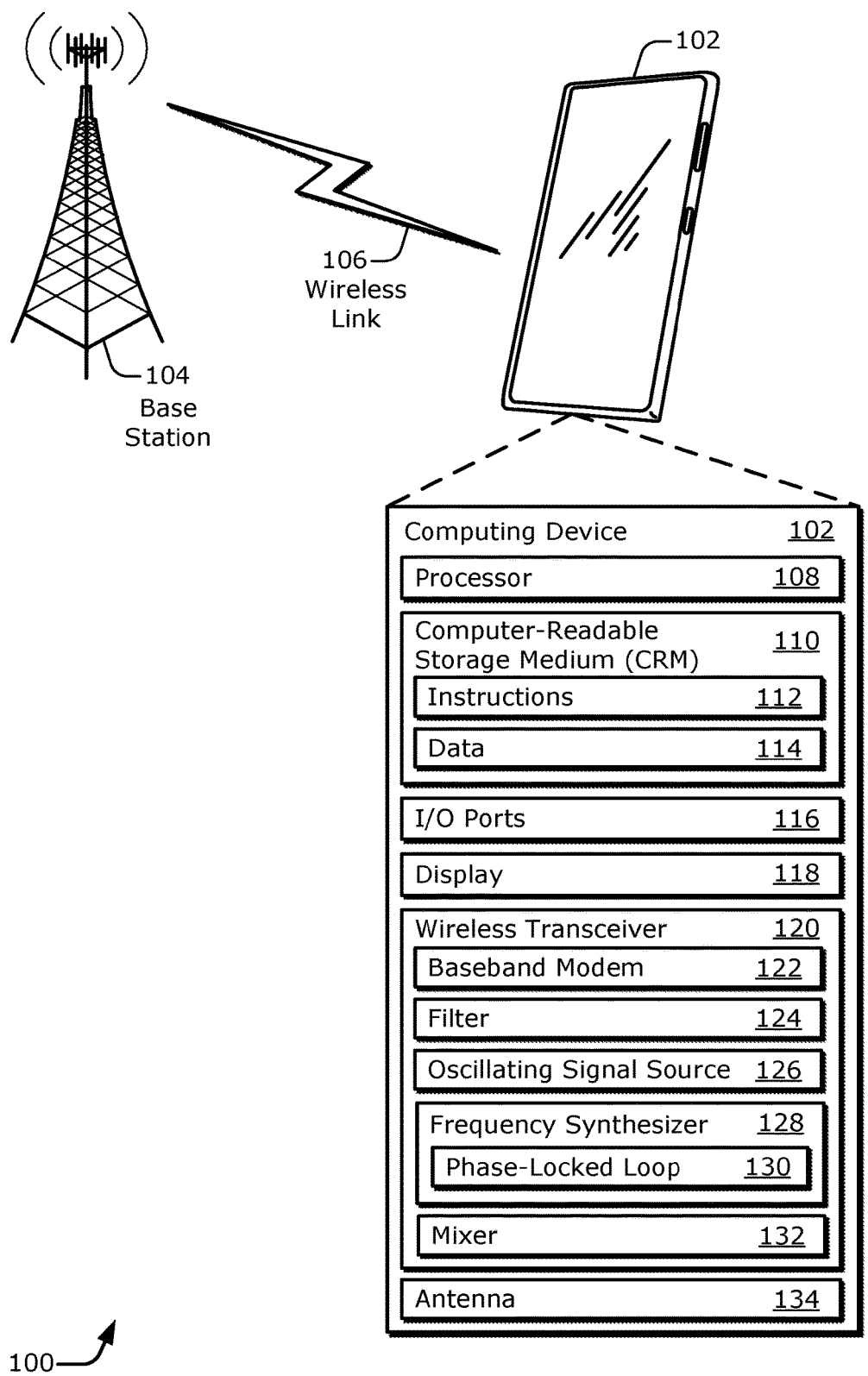
FIG. 1 illustrates an example environment that includes a wireless transceiver in which a phase-locked loop (PLL) with charge scaling can be implemented.

Generally, electronic communications are based on using signals that oscillate at different frequencies. Electronic devices use frequency synthesizers to create signals having different frequencies, and many frequency synthesizers include a phase-locked loop (PLL) to generate a desired frequency. Thus, phase-locked loops are instrumental in facilitating our modern interconnected society. However, phase-locked loops are relatively large, and therefore expensive, to include in an integrated circuit (IC) chip.

Integrated circuits function as the brains of electronic devices. Over time, developments in manufacturing technologies have enabled integrated circuit chips to become increasingly smaller by shrinking the size of the building blocks of each individual component of a given integrated circuit. Generally, the cost of an integrated circuit decreases as the total size of the circuit decreases. Consequently, the cost of integrated circuit chips, and the electronic devices that use them, has been reduced over time. Integrated circuit chips have therefore enabled electronic devices to become more portable and more affordable.

Unfortunately, the ability to rely on new manufacturing technologies to shrink the building blocks of circuits is becoming increasingly more difficult. On the other hand, there are alternative approaches to reducing the size of integrated circuits. For example, the number of components used to implement a given functionality can be lowered. Alternatively, a size of a given component can be reduced. Example implementations that are described herein enable a size of a component of a phase-locked loop to be reduced.

A phase-locked loop includes a number of components, such as a phase frequency detector, a charge pump, a filter, and a voltage-controlled oscillator. The filter, which is also referred to as the loop filter, includes a filter capacitor, which is sometimes called the loop-filter capacitor. This filter capacitor can be significantly larger than the other components combined. Thus, reducing a size of the filter capacitor can make a favorable and appreciable impact on a size of the overall phase-locked loop, and even a size of the integrated circuit chip in which the phase-locked loop is employed.

Typical approaches to reducing a size of a phase-locked loop, such as by reducing a size of the filter capacitor, result in different tradeoffs. For example, a size of the filter capacitor can be reduced, but jitter and/or noise is increased, which adversely impacts operation of the frequency synthesizer as well as the quality of associated electronic communications. Other tradeoffs involve, for instance, sacrificing frequency response or peaking attributes of the phase-locked loop. Another approach to reducing a size of a phase-locked loop is to implement the phase-locked loop in the digital domain. However, phase-locked loops that are implemented entirely, or even predominantly, in the digital domain usually suffer from characteristics that are unacceptable for high performance applications.

In contrast, implementations that are described herein enable a size of the filter capacitor of a phase-locked loop to be reduced without significantly impacting performance characteristics of the phase-locked loop, including without significantly increasing noise. In an example approach, charge, which is internal to a phase-locked loop and is applied to a filter capacitor thereof, is scaled downward. For instance, a charge manager component is coupled between a charge pump and a filter having the filter capacitor. The charge manager can, for instance, reduce the proportion of the charge applied to the filter capacitor by a factor of "1/N." Specifically, the charge manager can divert an "(N−1)/N" amount of charge away from the filter capacitor and forward the remaining "1/N" amount of charge to the filter capacitor. Accordingly, the size of the filter capacitor can be reduced by almost the factor of "1/N," while still achieving a given voltage level to drive the voltage-controlled oscillator. Thus, the filter capacitor can be reduced by a factor of, for instance, ½ to 1/10.

In example implementations, an integrated circuit is disclosed that implements a phase-locked loop with charge scaling. The integrated circuit includes a charge pump, a filter, and a charge manager. The charge pump generates a current signal, and the filter includes a filter capacitor. The charge manager is coupled between the charge pump and the filter. The charge manager includes current-sampling capacitance circuitry and a charge manager controller that is coupled to the current-sampling capacitance circuitry. The current-sampling capacitance circuitry receives the current signal from the charge pump and retains charge from the current signal to create stored charge, with the stored charge including a first charge portion and a second charge portion. The charge manager controller causes the current-sampling capacitance circuitry to communicate the first charge portion to the filter capacitor (e.g., route the first charge portion to the filter capacitor or pull the first charge portion from the filter capacitor). The charge manager controller also causes the current-sampling capacitance circuitry to divert the second charge portion away from the filter capacitor.

In some implementations, the current-sampling capacitance circuitry can include a diversion capacitor network and a control capacitor network. In a charge accumulation mode, capacitors of both the diversion capacitor network and the control capacitor network accumulate charge received from the charge pump. In contrast, in a charge dispersion mode, capacitors of the control capacitor network communicate their accumulated charge to the filter capacitor of the filter of the phase-locked loop, but capacitors of the diversion capacitor network divert their accumulated charge away from the filter capacitor. In these manners, by dividing the received charge into first and second charge portions and by diverting the second charge portion away from the filter capacitor, the filter capacitor of the phase-locked loop can have a smaller size while still providing a given voltage level for driving the voltage-controlled oscillator. With a smaller filter capacitor, a given phase-locked loop can occupy a smaller area on an integrated circuit chip and therefore be less expensive to implement.

FIG. 1 illustrates an example environment 100 that includes a wireless transceiver 120 in which a phase-locked loop 130 with charge scaling can be implemented. The example environment 100 includes a computing device 102 that communicates with a base station 104 through a wireless communication link 106 (wireless link 106). In this example, the computing device 102 is implemented as a smart phone. However, the computing device 102 may be implemented as any suitable computing or other electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, Internet-of-Things (IoTs) device, and so forth.

The base station 104 communicates with the computing device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, fiber optic line, electronic device generally, and so forth. Hence, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternatively or additionally, the display 118 may be implemented as a display port or virtual interface through which graphical content of the computing device 102 is communicated or presented.

For communication purposes, the computing device 102 also includes a wireless transceiver 120 and an antenna 134. The wireless transceiver 120 provides connectivity to respective networks and other electronic devices connected therewith. Additionally or alternatively, the computing device 102 may include a wired transceiver, such as an Ethernet or fiber optic interface for communicating over a personal or local network, an intranet, or the Internet. The wireless transceiver 120 may facilitate communication over any suitable type of wireless network, such as a wireless local area network (LAN) (WLAN), a peer-to-peer (P2P)

network, a mesh network, a cellular network, a wireless wide-area-network (WWAN), and/or a wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting or receiving a communication signal for at least one communication frequency band. In operation, the wireless transceiver 120 can implement at least one, e.g., radio frequency (RF) transceiver to process data and/or signals associated with communicating data of the computing device 102 via the antenna 134. As shown, the wireless transceiver 120 includes at least one baseband modem 122. The baseband modem 122 may be implemented as a system on-chip (SoC) that provides a digital communication interface for data, voice, messaging, and other applications of the computing device 102. The baseband modem 122 may also include baseband circuitry to perform high-rate sampling processes that can include analog-to-digital conversion (ADC), digital-to-analog conversion (DAC), gain correction, skew correction, frequency translation, and so forth.

Generally, the wireless transceiver 120 can include band-pass filters, switches, amplifiers, and so forth for routing and conditioning signals that are transmitted or received via the antenna 134. As shown, the wireless transceiver 120 also includes at least one filter 124, at least one oscillating signal source 126, at least one frequency synthesizer 128, and at least one mixer 132. Here, the frequency synthesizer 128 includes at least one phase-locked loop 130 (PLL 130). Thus, the wireless transceiver 120 can provide a measure of attenuation for wireless signals at different frequencies using the filter 124. The frequency synthesizer 128, using the oscillating signal source 126 and the phase-locked loop 130, can synthesize signals having one or more different frequencies. The wireless transceiver 120 can further perform frequency conversion using a synthesized signal and the mixer 132, which may include an upconverter and/or a downconverter that performs frequency conversion in a single conversion step, or through multiple conversion steps. The wireless transceiver 120 may also include logic to perform in-phase/quadrature (I/Q) operations, such as synthesis, encoding, modulation, demodulation, and decoding using a synthesized signal.

In some cases, components of the wireless transceiver 120 are implemented as separate receiver and transmitter entities. Additionally or alternatively, the wireless transceiver 120 can be realized using multiple or different sections to implement respective receiving and transmitting operations (e.g., using separate transmit and receive chains). Example operations of, as well as interactions between, the filter 124, the oscillating signal source 126, the frequency synthesizer 128—including the phase-locked loop 130, and the mixer 132 are described with reference to FIG. 2. The phase-locked loop 130 can at least partially implement a phase-locked loop with charge scaling as described herein.

Figure 2:
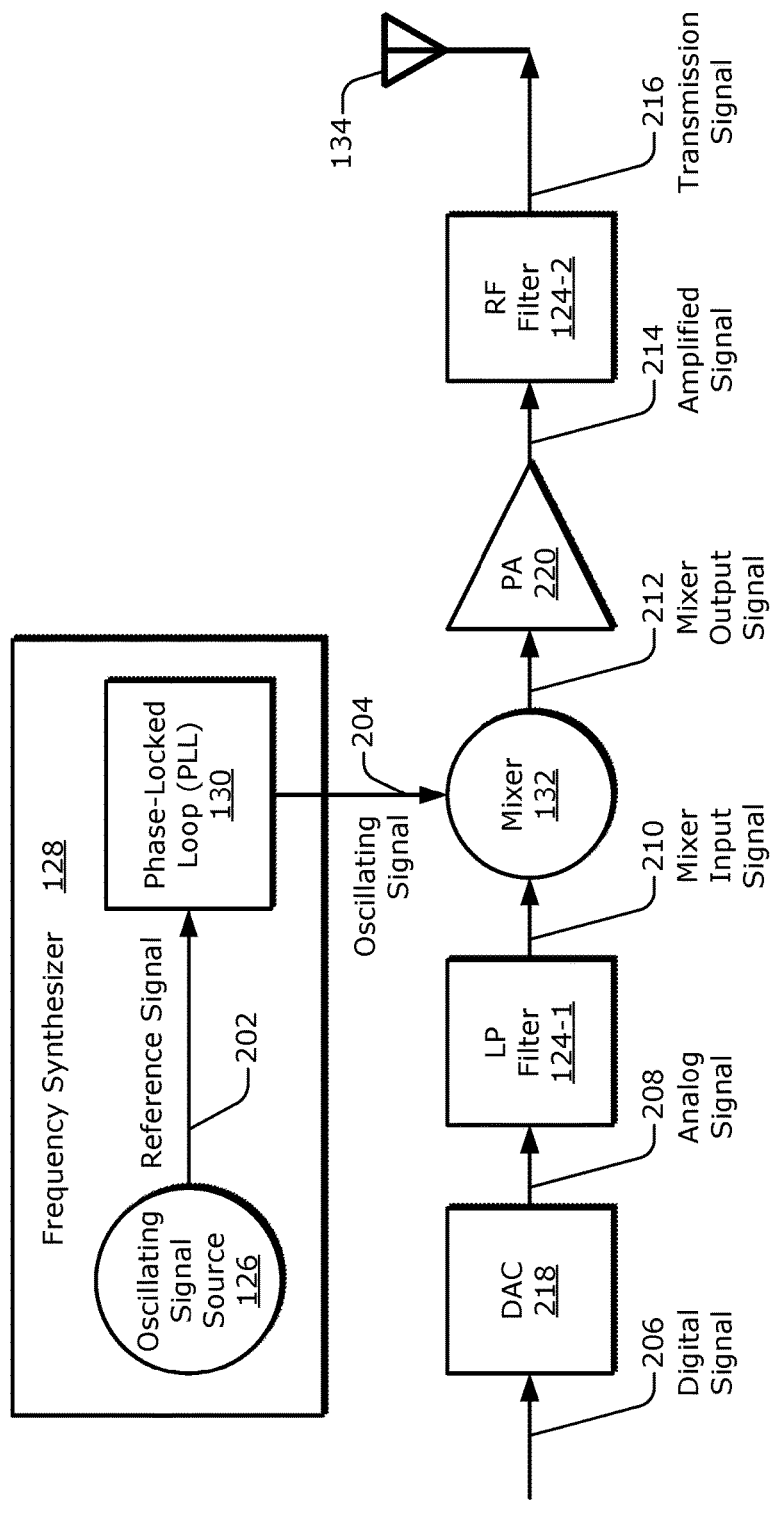
FIG. 2 illustrates an example wireless transceiver that includes a frequency synthesizer in which a phase-locked loop with charge scaling can be implemented to operate in conjunction with, e.g., a mixer in a transmit chain.

FIG. 2 illustrates an example of the wireless transceiver 120 that includes the frequency synthesizer 128 in which a phase-locked loop with charge scaling—e.g., the phase-locked loop 130—can be implemented to operate in conjunction with the mixer 132 in, e.g., a transmit chain. The example components of the wireless transceiver 120 are depicted in two rows: an upper row and a lower row. The upper row includes the oscillating signal source 126 and the phase-locked loop 130, which are shown to be part of the frequency synthesizer 128. From left-to-right, the lower row includes a digital-to-analog converter 218 (DAC 218), a low-pass filter 124-1 (LP filter 124-1), the mixer 132, a power amplifier 220 (PA 220), an RF filter 124-2, and the antenna 134.

In example implementations, for the upper row, the oscillating signal source 126 produces a reference signal 202. The reference signal 202 can oscillate at one or more frequencies for one or more purposes. For instance, the oscillating signal source 126 can be realized as a clock signal source, and the reference signal 202 can be realized as a clock signal. The oscillating signal source 126 can include an oscillator (e.g., a crystal oscillator) that generates a reference signal 202, can strengthen or condition a reference signal 202 received from another component, can change a frequency of a received reference signal 202, can selectively gate or release an incoming reference signal 202, some combination thereof, and so forth. Although the oscillating signal source 126 is illustrated as being part of the frequency synthesizer 128, the oscillating signal source 126 may alternatively be separate from the frequency synthesizer 128. Regardless, the oscillating signal source 126 is coupled to the phase-locked loop 130 and provides the reference signal 202 to the phase-locked loop 130.

Thus, the phase-locked loop 130 is coupled to the oscillating signal source 126 to receive the reference signal 202 as an input signal. The phase-locked loop 130 generates one or more oscillating signals having different frequencies based on the reference signal 202. To do so, the phase-locked loop 130 can lock onto and track a phase, and thus a frequency, of the reference signal 202 to produce at least one oscillating signal 204. The phase-locked loop 130 can generate an oscillating signal 204 having a frequency that is, for instance, some multiple of a frequency of the reference signal 202. The phase-locked loop 130 can therefore provide the oscillating signal 204 as a frequency-synthesizer output signal to the mixer 132. The mixer 132 can use the oscillating signal 204 to upconvert a lower-frequency input signal to a higher-frequency output signal for subsequent transmission by the transmit chain. This mixer input signal, and the mixing thereof, is described with reference to the lower row as depicted in FIG. 2.

In the lower row, the digital-to-analog converter 218 receives a digital signal 206, such as from the baseband modem 122 of FIG. 1. The digital-to-analog converter 218 performs a digital-to-analog conversion and produces an analog signal 208 based on the digital signal 206. The digital-to-analog converter 218 is coupled to the low-pass filter 124-1 and provides the analog signal 208 to the low-pass filter 124-1. The low-pass filter 124-1 performs a low-pass filtering operation by attenuating frequencies of the analog signal 208 that are above some cutoff frequency to produce a mixer input signal 210. The low-pass filter 124-1 is coupled to the mixer 132 and provides the mixer input signal 210 to the mixer 132.

The mixer 132 is coupled to the low-pass filter 124-1 and receives the mixer input signal 210 from the low-pass filter 124-1. The mixer 132 performs an upconverting operation to facilitate an, e.g., RF transmission from the wireless transceiver 120. To do so, the mixer 132 mixes the mixer input signal 210 with at least one higher-frequency signal, such as the oscillating signal 204. As a result of a mixing up-conversion operation, the mixer 132 produces a mixer output signal 212 that has a higher frequency than that of the mixer input signal 210 using the oscillating signal 204. The mixer 132 is coupled to the power amplifier 220 and provides the mixer output signal 212 to the power amplifier 220.

The power amplifier 220 amplifies the mixer output signal 212 to produce an amplified signal 214 having more power to emanate from the antenna 134. The power amplifier 220 is coupled to the RF filter 124-2 and provides the amplified signal 214 to the RF filter 124-2. The RF filter 124-2 filters the amplified signal 214 to accommodate the intended communication frequency band to produce a transmission signal 216. The RF filter 124-2 is coupled to the antenna 134 and provides the transmission signal 216 to the antenna 134. The antenna 134 can then emanate the transmission signal 216 from the wireless transceiver 120 as the wireless link 106 of FIG. 1. Although the phase-locked loop 130 is shown in the context of a transmit chain of the wireless transceiver 120, a phase-locked loop 130 with charge scaling as described herein can be used in a receive chain of a wireless transceiver 120, as well as in alternative environments and other scenarios.

Figure 3:
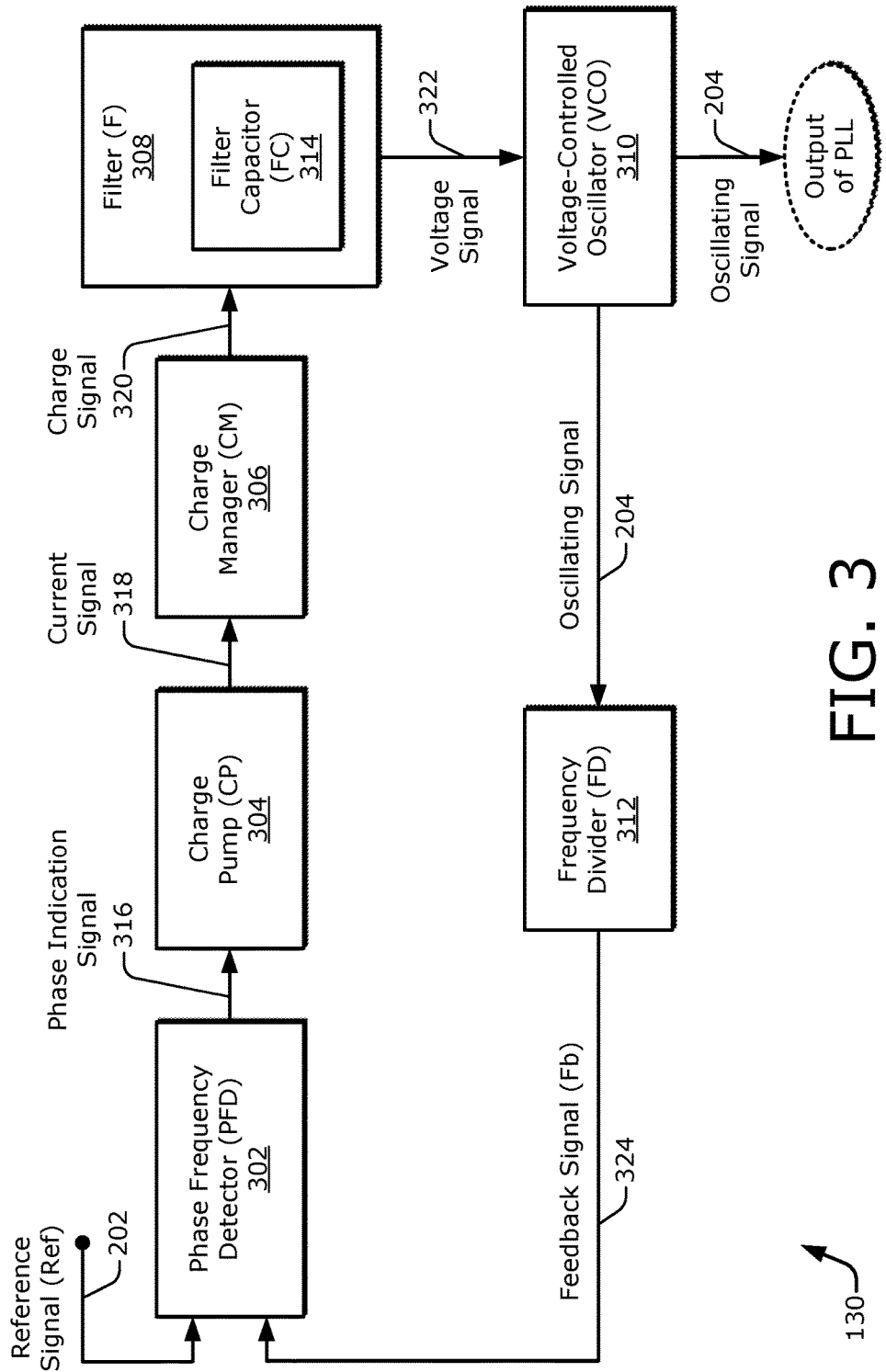
FIG. 3 illustrates an example phase-locked loop including a phase frequency detector, a charge pump, a filter having a filter capacitor, and a charge manager to implement charge scaling.

FIG. 3 illustrates an example phase-locked loop 130 including a phase frequency detector 302 (PFD), a charge pump 304 (CP), a filter 308 (F) having a filter capacitor 314 (FC), and a charge manager 306 configured to implement charge scaling. The phase-locked loop 130 also includes a voltage-controlled oscillator 310 (VCO) and a frequency divider 312 (FD). Example implementations of the phase-locked loop 130 are described at a relatively higher level with reference to FIG. 3. Example implementations of the phase frequency detector 302 and the charge pump 304 are described at a relatively lower level with reference to FIG. 4. Example implementations of the charge manager 306 and the filter 308 are described at a relatively lower level with reference to FIG. 5. And additional example implementations for the charge manager 306 are described with reference to FIGS. 6-11.

As shown, the phase frequency detector 302 is coupled to the charge pump 304, and the charge pump 304 is coupled to the charge manager 306. The charge manager 306 is coupled to the filter 308. Thus, the charge manager 306 is coupled between the charge pump 304 and the filter 308. The filter 308 is coupled to the voltage-controlled oscillator 310, and the voltage-controlled oscillator 310 is coupled to the frequency divider 312. To close or complete a signal propagation loop of the phase-locked loop 130, the frequency divider 312 is coupled to the phase frequency detector 302.

In example implementations, the phase-locked loop 130 utilizes a negative feedback path as part of the signal propagation loop. This description of a feedback loop of the phase-locked loop 130 starts at the top-left corner of FIG. 3 at the phase frequency detector 302 and continues in a clockwise direction. The phase frequency detector 302 receives the reference signal 202 (Ref) and a feedback signal 324 (Fb). From the phase frequency detector 302, signal flow of the phase-locked loop 130 continues to the charge pump 304. From the charge pump 304, the signal flow extends through the charge manager 306 to the filter 308, and the filter 308 provides a control signal to the voltage-controlled oscillator 310. The voltage-controlled oscillator 310 produces an output signal that is also fed back to the phase frequency detector 302, via the frequency divider 312, as part of the feedback path of the phase-locked loop 130.

In an example operation, the phase frequency detector 302 produces a phase indication signal 316 based on a phase difference between the reference signal 202 and the feedback signal 324. The charge pump 304 receives the phase indication signal 316, which is indicative of the phase difference, and converts the phase indication signal 316 to a current signal 318. The charge pump 304 provides the current signal 318 to the charge manager 306. The charge manager 306, as part of a charge accumulation mode, accumulates charge provided from the charge pump 304 by the current signal 318. As part of a charge dispersion mode (e.g., that is in effect at a different time), the charge manager 306 disperses the accumulated charge. A portion (e.g., a first charge portion) of the accumulated charge is communicated (e.g., applied) to the filter 308 as a charge signal 320. For example, the portion of the accumulated charge can be routed to or pulled from the filter 308 to communicate the charge signal 320. Another portion (e.g., a second charge portion) of the accumulated charge is diverted away from the filter 308. Schemes for realizing the different charge modes and for dispersing portions of the charge to different destinations to implement charge scaling are described below with reference to FIG. 6 and subsequent drawings.

Thus, the charge manager 306 provides the charge signal 320 to the filter 308. Specifically, the charge from the charge signal 320 is applied to the filter capacitor 314. This applied charge can increase or decrease a voltage level associated with the filter capacitor 314. The voltage level of the filter capacitor 314 can serve as a voltage signal 322. In effect, the filter 308 uses the filter capacitor 314 to integrate the charge signal 320, which is a scaled version of the current signal 318, by charging the filter capacitor 314 (e.g., in which charging can include adding charge to or removing charge from the filter capacitor 314). The filter 308 can also perform a low-pass filtering as part of the operation to generate the voltage signal 322.

The filter 308 provides the voltage signal 322 to the voltage-controlled oscillator 310. The voltage-controlled oscillator 310 functions as an oscillator having a frequency that is proportional to a magnitude of the voltage signal 322. Hence, the voltage-controlled oscillator 310 produces the oscillating signal 204 based on the voltage signal 322 obtained from the filter 308. The oscillating signal 204 can represent an output signal of the phase-locked loop 130. The oscillating signal 204 is also used to continue the feedback loop of the phase-locked loop 130. The oscillating signal 204 can be fed directly back to the phase frequency detector 302 without modification (e.g., where the feedback signal 324 comprises an unmodified version of the oscillating signal 204). However, as illustrated in FIG. 3, the voltage-controlled oscillator 310 provides the oscillating signal 204 to the frequency divider 312. The frequency divider 312 generates the feedback signal 324 based on the oscillating signal 204 and a frequency divider value or ratio, which can be fixed or adjustable. The frequency divider 312 provides the feedback signal 324 to the phase frequency detector 302 to complete the feedback loop of the phase-locked loop 130.

Figure 4:
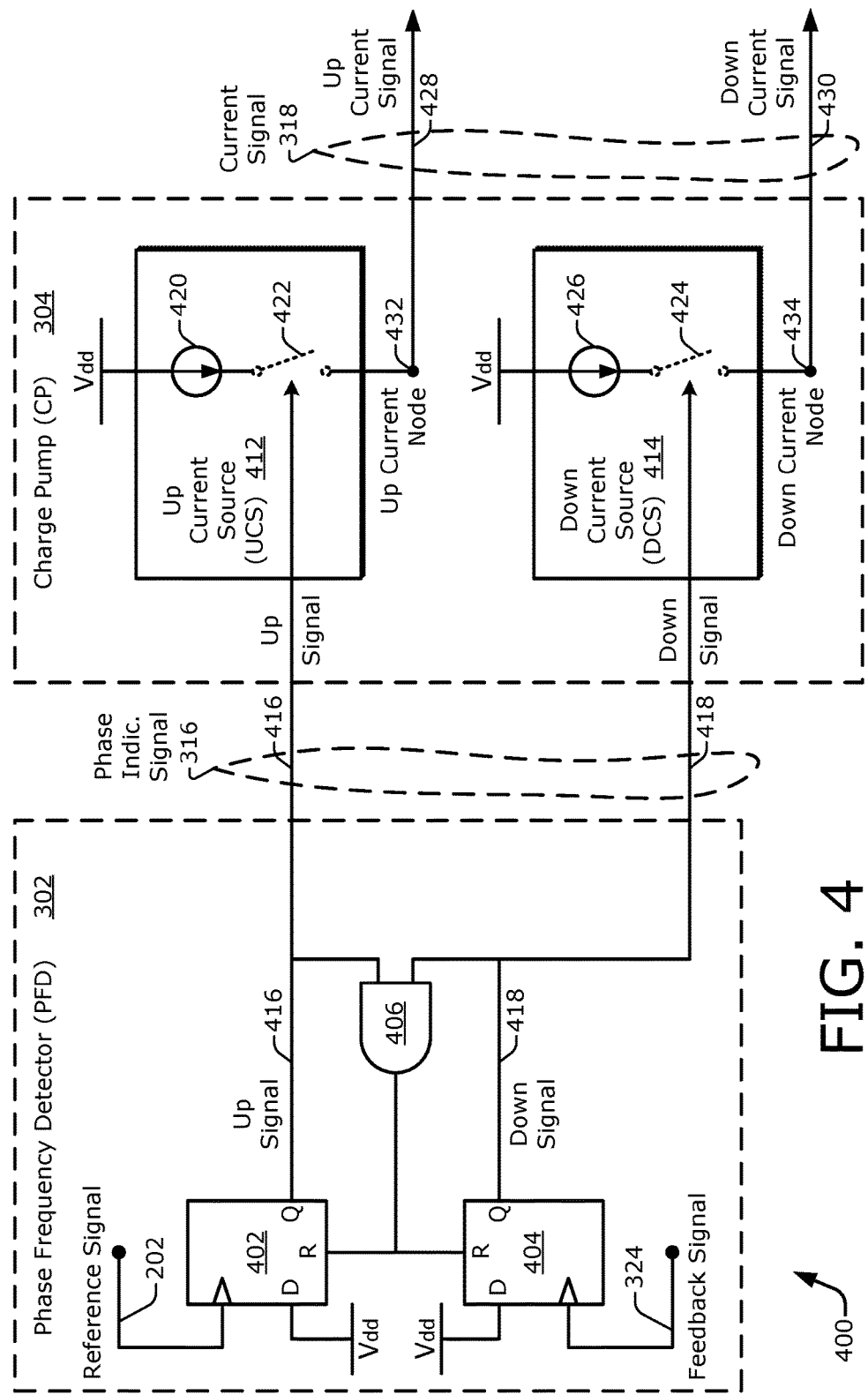
FIG. 4 illustrates, for a phase-locked loop, an example of circuitry for a phase frequency detector and an example of circuitry for a charge pump.

FIG. 4 illustrates generally at 400 an example of circuitry for the phase frequency detector 302 and an example of circuitry for the charge pump 304. As illustrated, the phase frequency detector 302 includes two "DQ" flip-flops, a flip-flop 402 and a flip-flop 404; and an AND gate 406. Although not explicitly shown, the phase frequency detector 302 can also include one or more buffers to provide the phase indication signal 316 to the charge pump 304. Each "DQ" flip-flop includes a "D" input, a "Q" output, a clocking input (">"), and a reset terminal (R). The AND gate 406 includes a first input, a second input, and an output.

The "D" input of the flip-flop 402 is coupled to a source voltage (Vdd). The reference signal 202 is coupled to the clocking input of the flip-flop 402. The "Q" output of the flip-flop 402 produces an up signal 416 that is provided to the charge pump 304 as part of the phase indication signal 316, as indicated by the dashed-line loop in the middle of FIG. 4. The up signal 416 is also coupled to the first input of the AND gate 406. The output of the AND gate 406 is coupled to the reset terminal (R) of the flip-flop 402.

The "D" input of the flip-flop 404 is coupled to the source voltage (Vdd). The feedback signal 324 is coupled to the clocking input of the flip-flop 404. The "Q" output of the flip-flop 404 produces a down signal 418 that is provided to the charge pump 304 as another part of the phase indication signal 316. The down signal 418 is coupled to the second input of the AND gate 406. The output of the AND gate 406 is coupled to the reset terminal (R) of the flip-flop 404.

In operation, the two edge-triggered clocking inputs of the flip-flops 402 and 402 work in conjunction with the "D" inputs and the reset terminals (R) thereof using a feedback path that is internal to the phase frequency detector 302. The internal feedback path includes the AND gate 406. When the reference signal 202 and the feedback signal 324 are both high, the previous rising edge of these two signals cause both the up signal 416 and the down signal 418 to be high because the "D" inputs are tied high to the source voltage (Vdd). This causes the AND gate 406 to output a high signal, which acts as a reset signal that triggers the reset terminal (R) of each of the flip-flop 402 and the flip-flop 404. Responsive to a rising edge of the reset signal at the respective reset terminal (R), the flip-flop 402 changes the corresponding "Q" output to be low, and thus causes the up signal 416 to have a low value. Similarly, the flip-flop 404 changes the corresponding "Q" output to be low, and thus causes the down signal 418 to have a low value responsive to a rising edge of the reset signal at the respective reset terminal (R) of the flip-flop 404. Whichever incoming signal, either the reference signal 202 or the feedback signal 324 goes high first, the signal at the corresponding "Q" output will likewise be driven high, either the up signal 416 or the down signal 418, respectively. This output signal will remain high until the other incoming signal goes high, thereby causing the AND gate 406 to trigger the reset terminals (R).

The charge pump 304 includes an up current source 412 (UCS) and a down current source 414 (DCS). The up current source 412 and the down current source 414 are each coupled between the source voltage (Vdd) and a respective node. Specifically, the up current source 412 is coupled between the source voltage (Vdd) and an up current node 432, and the down current source 414 is coupled between the source voltage (Vdd) and a down current node 434. However, the current sources may be arranged in alternative manners.

Figure 8:
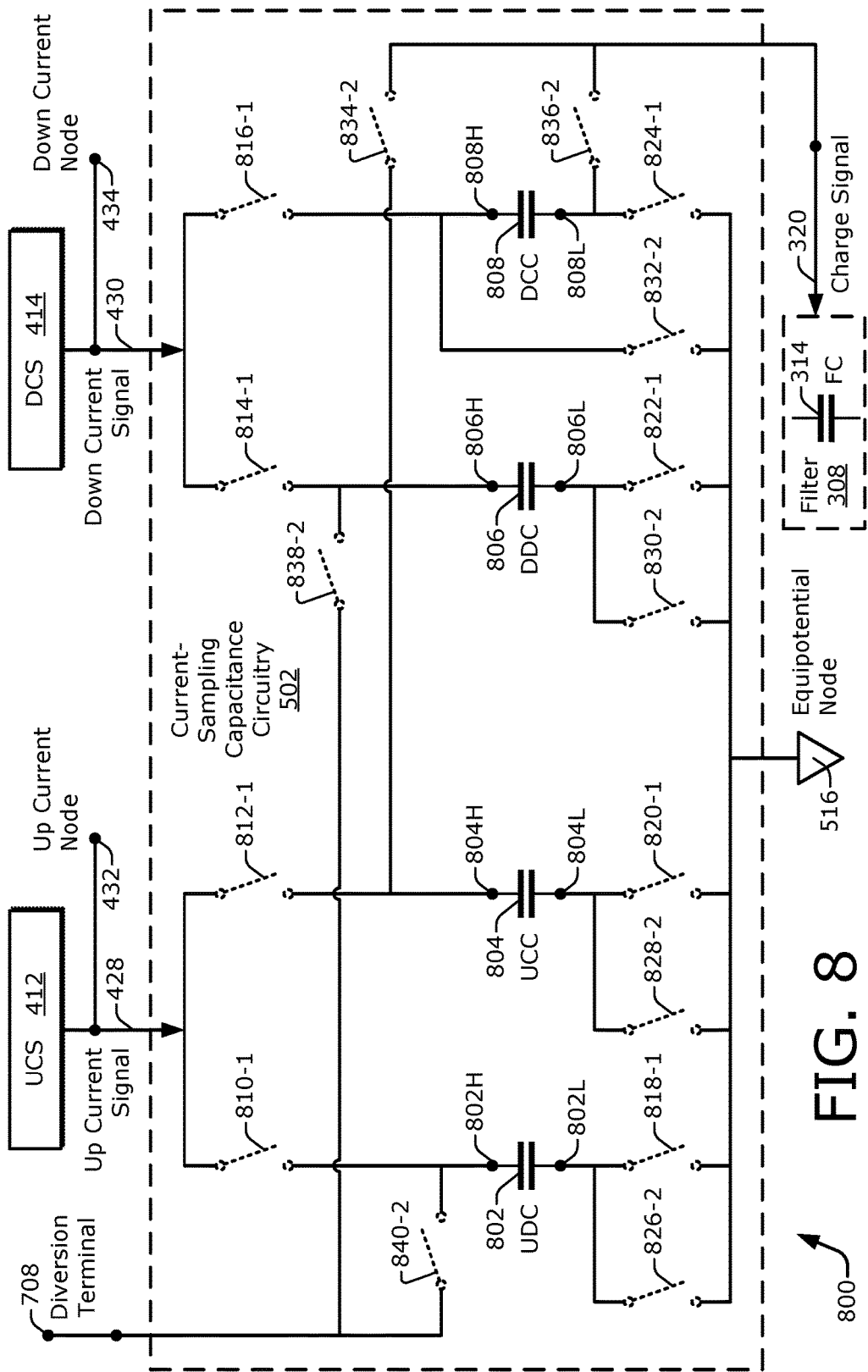
FIG. 8 illustrates example components for the current-sampling capacitance circuitry that includes multiple capacitors and multiple switches.
Figure 9:
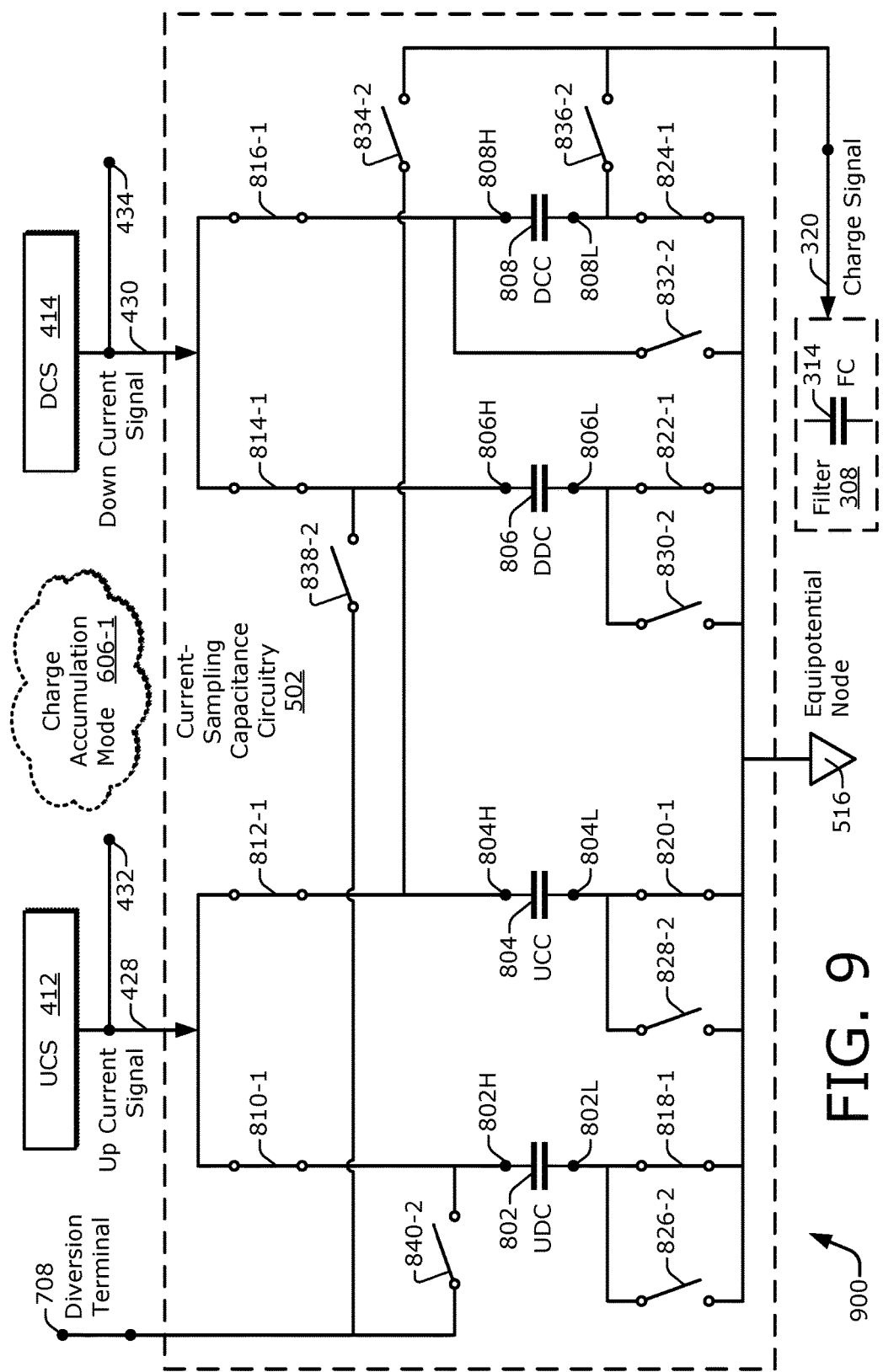
FIG. 9 illustrates a particular configuration for the components of the current-sampling capacitance circuitry of FIG. 8 with the multiple switches in example states to institute a charge accumulation mode.
Figure 10:
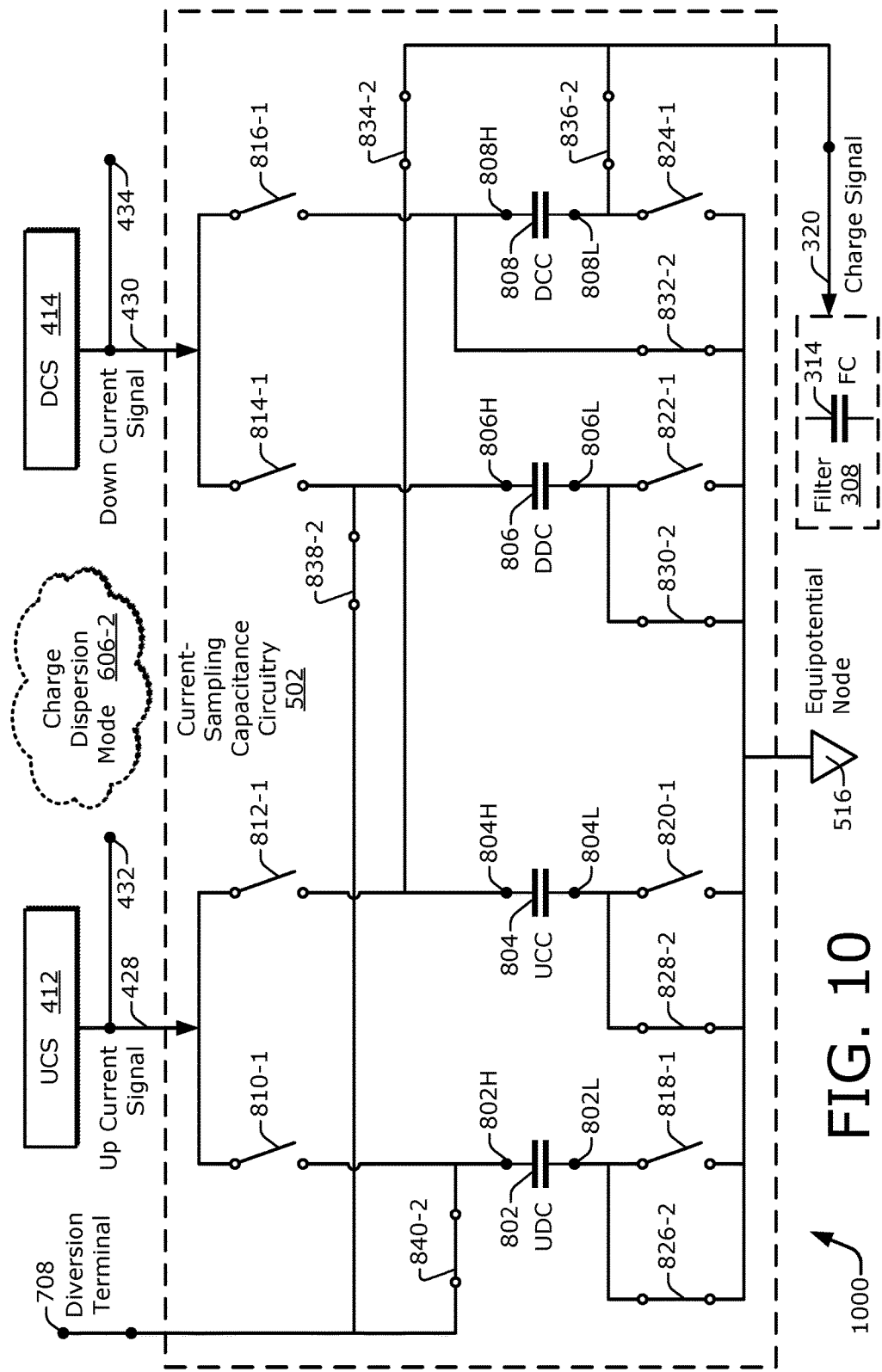
FIG. 10 illustrates another particular configuration for the components of the current-sampling capacitance circuitry of FIG. 8 with the multiple switches in example states to institute a charge dispersion mode.

The up current source 412 includes a current source 420 and an up switch 422. The down current source 414 includes a current source 426 and a down switch 424. In the drawings, switches having an undefined state are depicted with small-dashed lines, as shown in FIGS. 4 and 8. Switches in a defined state (e.g., an open or a closed state) are depicted with solid lines, as shown in FIGS. 9 and 10. A state of the up switch 422 is controlled by the up signal 416. If the up signal 416 is e.g. high, the up switch 422 is closed. If the up switch 422 is closed, current from the current source 420 can flow from the up current node 432 as an up current signal 428. Analogously, a state of the down switch 424 is controlled by the down signal 418. If the down signal 418 is e.g. high, the down switch 424 is in a closed state. If the down switch 424 is in the closed state, current from the current source 426 can flow from the down current node 434 as a down current signal 430.

In some implementations, the "up" current signal 428 refers to current that is to add charge to the filter capacitor 314 (of FIG. 3) and thereby increase the voltage potential across the filter capacitor 314. Conversely, the "down" current signal 430 refers to current that is to reduce the charge at the filter capacitor 314 and thereby decrease the voltage potential across the filter capacitor 314.

Thus, the phase indication signal 316, including the up signal 416 and the down signal 418, can control operation of the charge pump 304. The up signal 416 controls the up current signal 428 that flows from the up current node 432. The down signal 418 controls the down current signal 430 that flows from the down current node 434. The current signal 318, which is generated by the charge pump 304 and provided to the charge manager 306 (of FIG. 3), includes the up current signal 428 and the down current signal 430, as indicated by the dashed-line loop on the right of FIG. 4. Example implementations for how the charge manager 306 receives and processes the up current signal 428 and the down current signal 430 to realize charge scaling with the phase-locked loop 130 are described below with reference to FIGS. 5-10.

Figure 5:
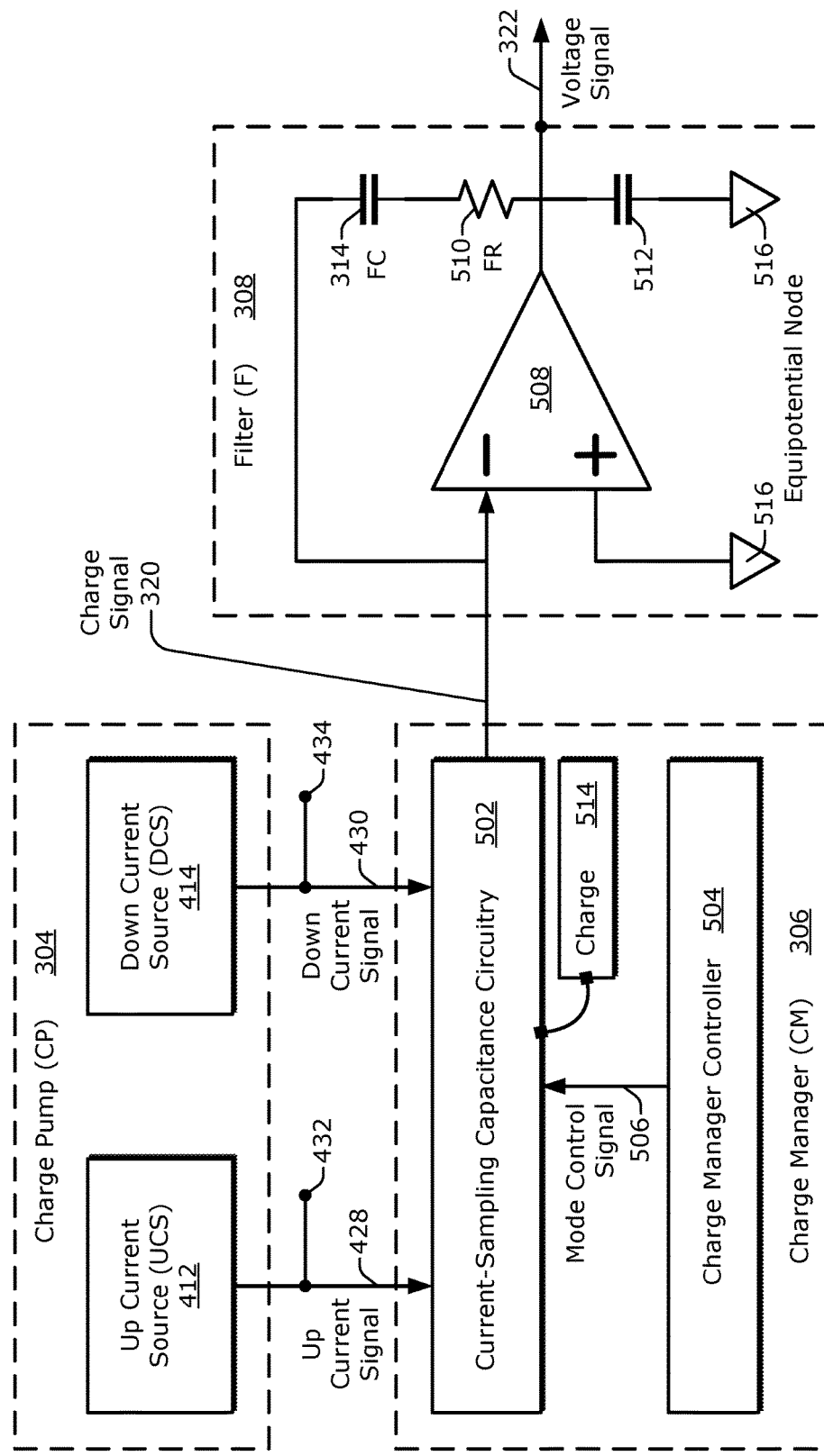
FIG. 5 illustrates an example charge manager to implement charge scaling in conjunction with a filter capacitor of a filter.

FIG. 5 illustrates generally at 500 an example charge manager 306 to implement charge scaling in conjunction with the filter capacitor 314 of the filter 308. The up current source 412 and the down current source 414 are shown as part of the charge pump 304. The up current source 412 provides the up current signal 428 at the up current node 432, and the down current source 414 provides the down current signal 430 at the down current node 434. The charge manager 306 is coupled to the charge pump 304 at the up current node 432 and the down current node 434. Thus, the charge manager 306 receives the up current signal 428 from the up current source 412 via the up current node 432. And the charge manager 306 receives the down current signal 430 from the down current source 414 via the down current node 434.

In example implementations, the charge manager 306 includes current-sampling capacitance circuitry 502 and a charge manager controller 504. The current-sampling capacitance circuitry 502 receives the up current signal 428 and the down current signal 430. The current-sampling capacitance circuitry 502 can obtain some charge 514 that is received from the charge pump 304 via the current signal 318 (of FIG. 4) as part of the up current signal 428 or the down current signal 430. The current-sampling capacitance circuitry 502 can retain the charge 514 from the charge pump 304 to create stored charge 514. The stored charge 514 can include a first charge portion and a second charge portion, which are described below with reference to FIG. 7. The charge manager controller 504 generates a mode control signal 506 and provides the mode control signal 506 to the current-sampling capacitance circuitry 502. The current-sampling capacitance circuitry 502 operates in different charge modes responsive to the mode control signal 506. Different charge modes are described below with reference to FIG. 6.

In an example operation, the current-sampling capacitance circuitry 502 of the charge manager 306 applies at least a portion of the charge 514 to the filter capacitor 314 using the charge signal 320 to affect a voltage level associated with the filter capacitor 314. As shown, an example implementation of the filter 308 includes an amplifier, such as an operational amplifier 508, the filter capacitor 314, a filter resistor 510 (FR), and a bias capacitor 512. The operational amplifier 508 includes a first input (−), a second input (+), and an output. The second input is coupled to the equipotential node 516, such as ground. The first input of the operational amplifier 508 is coupled to the current-sampling capacitance circuitry 502 to receive the charge signal 320.

The first input of the operational amplifier 508 is also coupled to the filter capacitor 314. The filter capacitor 314 is coupled to the filter resistor 510, which is coupled to the output of the operational amplifier 508. The bias capacitor 512 is coupled between the output of the operational amplifier 508 and the equipotential node 516. The output of the operational amplifier 508 also serves to provide the voltage signal 322, which the filter 308 further provides to the voltage-controlled oscillator 310, as is described above with reference to FIG. 3.

The charge signal 320 is applied to the filter capacitor 314 to affect a voltage potential across the filter capacitor 314. In operation, the filter 308 can integrate the portion of the charge 514 that is communicated to (e.g., routed to or pulled from) the filter capacitor 314. Thus, the filter 308 provides a mechanism for integrating a portion of the charge 514 using the filter capacitor 314. Dividing the charge 514 into multiple portions, which can facilitate charge scaling, is described below with reference to FIG. 7.

By applying stored charge to the filter capacitor 314, a voltage level associated with the filter capacitor 314 is affected (e.g., increased or decreased). In the example filter 308 that is depicted in FIG. 5, the affected voltage level that is associated with the filter capacitor 314 can correspond to a node of the first input of the operational amplifier 508, a node between the filter capacitor 314 and the filter resistor 510, a node of the output of the operational amplifier 508, and so forth. Although a specific example circuit for the filter 308 is depicted in FIG. 5 and described above, the filter 308 can be implemented in alternative manners.

Figure 6:
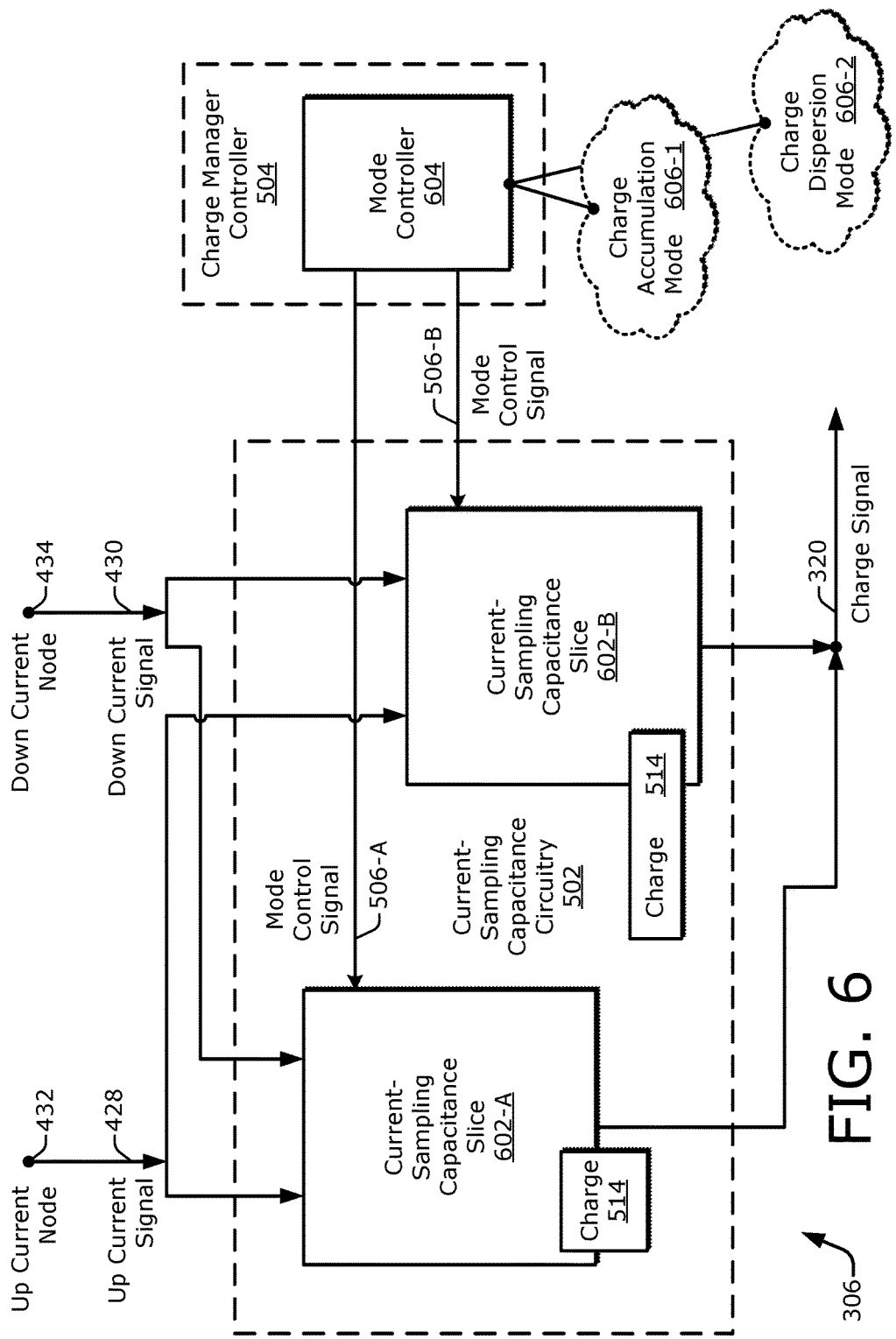
FIG. 6 illustrates an example charge manager including current-sampling capacitance circuitry and a charge manager controller having a mode controller to institute a charge accumulation mode or a charge dispersion mode.

FIG. 6 illustrates an example charge manager 306 including current-sampling capacitance circuitry 502 and a charge manager controller 504. The charge manager controller 504 includes a mode controller 604 to institute a charge mode, such as a charge accumulation mode 606-1 or a charge dispersion mode 606-2. As shown, the current-sampling capacitance circuitry 502 includes a current-sampling capacitance slice 602-A and a current-sampling capacitance slice 602-B. The current-sampling capacitance slice 602-A is coupled to the up current node 432 and to the down current node 434 to receive the up current signal 428 and the down current signal 430, respectively. Likewise, current-sampling capacitance slice 602-B is also coupled to the up current node 432 and to the down current node 434 to receive the up current signal 428 and the down current signal 430, respectively. Although two slices are explicitly depicted and described below, more or fewer slices can alternatively be implemented.

The current-sampling capacitance slice 602-A can be implemented similarly to the current-sampling capacitance slice 602-B. For example, each slice can include components that are at least similar to each other in terms of constituent parts and interconnectedness. However, the mode controller 604 can cause the two different slices to operate in a different charge mode at different times. If operating in the charge accumulation mode 606-1, a current-sampling capacitance slice is receiving charge via the up current signal 428 and the down current signal 430 and is retaining the received charge as the charge 514. On the other hand, if operating in the charge dispersion mode 606-2, a current-sampling capacitance slice is dispersing the charge 514—e.g., to the filter capacitor 314 or away from the filter capacitor 314.

In some implementations, while operating in the charge dispersion mode 606-2, a given current-sampling capacitance slice is not also receiving current from the charge pump 304 via the up current signal 428 or the down current signal 430. However, for the phase-locked loop 130 to properly lock onto a phase of a reference signal 202, charge that is being issued by the charge pump 304 is still registered for eventual application to, and integration by, the filter capacitor 314. Thus, to avoid "missing" any up or down current signals from the charge pump 304, at least one current-sampling capacitance slice is operating in the charge accumulation mode 606-1 at any given time.

For example, the mode controller 604 can use a mode control signal 506-A to place the current-sampling capacitance slice 602-A in the charge accumulation mode 606-1 and use a mode control signal 506-B to place the current-sampling capacitance slice 602-B in the charge dispersion mode 606-2. In accordance with some duty cycle, such as a 50-50 duty cycle, the mode controller then switches the roles of the two slices. To do so, the mode controller 604 uses the mode control signal 506-A to place the current-sampling capacitance slice 602-A in the charge dispersion mode 606-2 and the mode control signal 506-B to place the current-sampling capacitance slice 602-B in the charge accumulation mode 606-1.

In these manners, one current-sampling capacitance slice is receiving charge from the charge pump 304, and another current-sampling capacitance slice is providing a portion of the previously-received charge to the filter 308. By employing an approach with at least two slices, no charge that is issued by the charge pump 304 is missed. For clarity, the following discussion of the operation of the current-sampling capacitance circuitry 502 is set forth for one current-sampling capacitance slice. However, the mode controller 604 can be simultaneously operating another current-sampling capacitance slice in a different charge mode.

Figure 7:
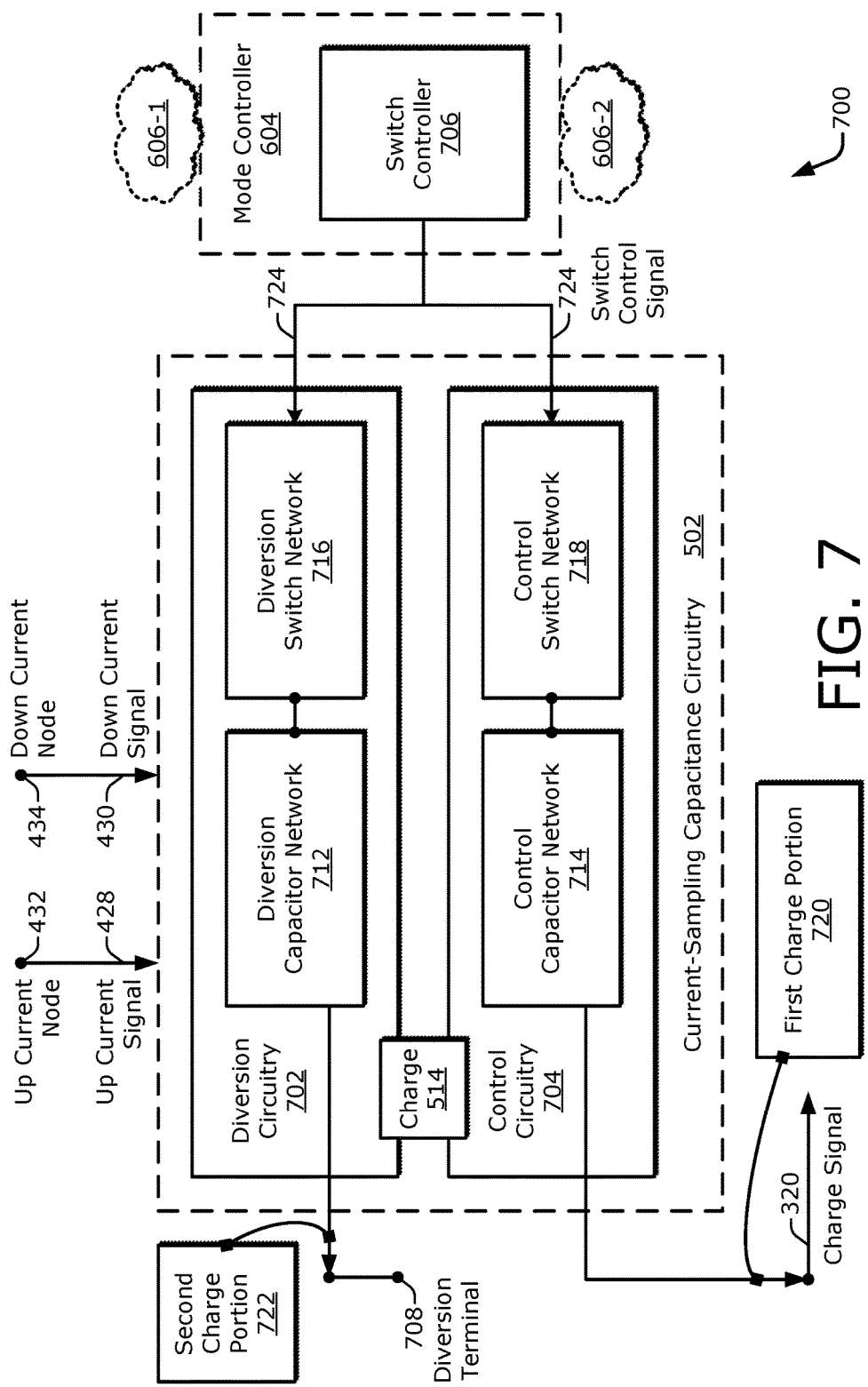
FIG. 7 illustrates an example of current-sampling capacitance circuitry that includes capacitor networks and switch networks and an example mode controller having a switch controller.

FIG. 7 illustrates generally at 700 an example of current-sampling capacitance circuitry 502 and an example mode controller 604 having a switch controller 706. The current-sampling capacitance circuitry 502 includes capacitor networks and switch networks. These networks are separated into a diversion part and a control part. As shown, the current-sampling capacitance circuitry 502 includes diversion circuitry 702 and control circuitry 704. The diversion circuitry 702 includes a diversion capacitor network 712 and a diversion switch network 716. The control circuitry 704 includes a control capacitor network 714 and a control switch network 718. Each capacitor network includes at least one capacitor, and each switch network includes at least one switch. Example implementations for the capacitor and switch networks are described below at the capacitor and switch level with reference to FIGS. 8-10.

The current-sampling capacitance circuitry 502 receives from the charge pump 304 the charge 514 that is provided by the up current signal 428 and the down current signal 430. This charge 514 is divided into two portions: a first charge portion 720 and a second charge portion 722. In the charge accumulation mode 606-1, both the diversion circuitry 702 and the control circuitry 704 accumulate charge from a same source, the charge pump 304. The diversion circuitry 702 accumulates the second charge portion 722 from both the up current signal 428 and the down current signal 430. The control circuitry 704 accumulates the first charge portion 720 from both the up current signal 428 and the down current signal 430.

In the charge dispersion mode 606-2, both the diversion circuitry 702 and the control circuitry 704 disperse the accumulated charge. However, the diversion circuitry 702 and the control circuitry 704 disperse charge to different destinations. The diversion circuitry 702 disperses the second charge portion 722 to a diversion terminal 708 and away from the filter capacitor 314. In contrast, the control circuitry 704 disperses the first charge portion 720 to the filter capacitor 314 as indicated by the charge signal 320, which is communicated to/applied to the filter 308 (of FIGS. 3 and 5). Thus, the diversion circuitry 702 is responsible for "diverting" a portion of the charge 514, which is the second charge portion 722, as received from the charge pump 304. The control circuitry 704, on the other hand, is responsible for using another portion of the charge 514, which is the first charge portion 720, to "control" the voltage level of the filter capacitor 314.

The diversion terminal 708 is uncoupled from the filter capacitor 314 such that charge can be applied to the diversion terminal 708 without appreciably affecting a voltage level associated with the filter capacitor 314. The diversion terminal 708 can be implemented, for example, as the equipotential node 516 (not shown in FIG. 7) to dissipate the second charge portion 722. Alternatively, the diversion terminal 708 can be implemented as a storage component to save the second charge portion 722, as a power rail or power source to conserve or reuse the second charge portion 722, and so forth.

In FIG. 7, the mode control signal 506 (of FIGS. 5 and 6) is implemented as at least one switch control signal 724. The switch controller 706 issues the switch control signal 724 to establish an open or closed state of the switches in the diversion switch network 716 and the control switch network 718. The open or closed state of the various switches can establish a charge mode—e.g., the charge accumulation mode 606-1 or the charge dispersion mode 606-2. For example, the states of the switches of the diversion switch network 716 and the control switch network 718 can be respectively established such that the diversion capacitor network 712 and the control capacitor network 714 receive charge from the charge pump 304 for the charge accumulation mode 606-1.

Thus, the diversion circuitry 702 provides a mechanism for diverting away from the filter capacitor 314 a second charge portion 722 of the charge 514 provided by the up current signal 428 and the down current signal 430. The control circuitry 704 provides a mechanism for controlling a voltage level associated with the filter capacitor 314 based on a first charge portion 720 of the charge 514 provided by the up current signal 428 or the down current signal 430. The presence, positions, and interconnections of these switches are described below with reference to FIG. 8. States of the switches to place the current-sampling capacitance circuitry 502 in the charge accumulation mode 606-1 are described with reference to FIG. 9. States of the switches to place the current-sampling capacitance circuitry 502 in the charge dispersion mode 606-2 are described with reference to FIG. 10.

FIG. 8 illustrates generally at 800 example components, including multiple capacitors and multiple switches, for the current-sampling capacitance circuitry 502. As shown, the current-sampling capacitance circuitry 502 is coupled to the up current source 412 (UCS) and the down current source 414 (DCS) at the up current node 432 and at the down current node 434, respectively. The current-sampling capacitance circuitry 502 is also coupled to the diversion terminal 708 and to the filter 308 as indicated by the charge signal 320.

In example implementations, from right-to-left, the current-sampling capacitance circuitry 502 includes four capacitors: a down control capacitor 808 (DCC), a down diversion capacitor 806 (DDC), an up control capacitor 804 (UCC), and an up diversion capacitor 802 (UDC). The down control capacitor 808 and the up control capacitor 804 form at least part of the control capacitor network 714 (of FIG. 7). The down diversion capacitor 806 and the up diversion capacitor 802 form at least part of the diversion capacitor network 712. Generally, the down control capacitor 808 and the down diversion capacitor 806 are coupled to, such as by being switchably coupled to, the down current source 414. The up control capacitor 804 and the up diversion capacitor 802 are coupled to, such as by being switchably coupled to, the up current source 412. The control capacitor network 714 provides a capacitive control mechanism for retaining the first charge portion 720 for the charge accumulation mode 606-1. The diversion capacitor network 712 provides a capacitive diversion mechanism for retaining the second charge portion 722 for the charge accumulation mode 606-1.

The current-sampling capacitance circuitry 502 also includes 16 switches. The reference number of each switch includes a numerical suffix, either "−1" or "−2." In some implementations, those switches with a "−1" suffix are closed for the charge accumulation mode 606-1 and open for the charge dispersion mode 606-2. In contrast, those switches with a "−2" suffix are closed for the charge dispersion mode 606-2 and open for the charge accumulation mode 606-1. These switch states, which are established by the switch controller 706 (of FIG. 7) using at least one switch control signal 724, are described further with reference to FIGS. 9 and 10.

Each of the control switch network 718 and the diversion switch network 716 includes eight switches. Specifically, the control switch network 718 includes switches that are coupled to one of the two control capacitors, namely switches 812-1, 820-1, 828-2, 834-2, 816-1, 824-1, 832-2, and 836-2. The diversion switch network 716 includes switches that are coupled to one of the two diversion capacitors, namely switches 810-1, 818-1, 840-2, 826-2, 814-1, 822-1, 838-2, and 830-2. Each switch can be implemented with, for example, a transistor. Each transistor can be implemented as a field effect transistor (FET); however, other transistor types may alternatively be utilized.

Thus, the control switch network 718 provides a switch control mechanism for disconnecting control capacitors (e.g., the up control capacitor 804 and the down control capacitor 808) from the charge pump 304 and connecting the control capacitors to the filter capacitor 314 for the charge dispersion mode 606-2. The diversion switch network 716 provides a switch diversion mechanism for disconnecting the diversion capacitors (e.g., the up diversion capacitor 802 and the down diversion capacitor 806) from the charge pump 304 and connecting the diversion capacitors to the diversion terminal 708 for the charge dispersion mode 606-2.

Each capacitor includes a higher potential terminal and a lower potential terminal. The lower potential terminal is closer to the equipotential node 516, such as a ground potential, than the higher potential terminal. The down control capacitor 808 includes a higher potential terminal 808H and a lower potential terminal 808L. The down diversion capacitor 806 includes a higher potential terminal 806H and a lower potential terminal 806L. The up control capacitor 804 includes a higher potential terminal 804H and a lower potential terminal 804L. The up diversion capacitor 802 includes a higher potential terminal 802H and a lower potential terminal 802L.

As shown on the right side of FIG. 8 for the down current signal 430, the current-sampling capacitance circuitry 502 includes at least one first down control switch 816-1 or 824-1 coupled in series with the down control capacitor 808 between the down current source 414 and the equipotential node 516. The circuitry further includes at least one second down control switch 832-2 or 836-2 coupled in series with the down control capacitor 808 between the filter capacitor 314 and the equipotential node 516. The current-sampling capacitance circuitry 502 also includes at least one first down diversion switch 814-1 or 822-1 coupled in series with the down diversion capacitor 806 between the down current source 414 and the equipotential node 516. The circuitry further includes at least one second down diversion switch 830-2 or 838-2 coupled in series with the down diversion capacitor 806 between the diversion terminal 708 and the equipotential node 516.

Thus, for switches pertaining to the charge accumulation mode 606-1 and the down current signal 430, the at least one first down control switch can comprise a first down control switch 816-1 coupled between the down current source 414 and the down control capacitor 808 or a first down control switch 824-1 coupled between the down control capacitor 808 and the equipotential node 516. The at least one first down diversion switch can comprise a first down diversion switch 814-1 coupled between the down current source 414 and the down diversion capacitor 806 or a first down diversion switch 822-1 coupled between the down diversion capacitor 806 and the equipotential node 516.

Similarly, for switches pertaining to the charge dispersion mode 606-2 and the down current signal 430, the at least one second down control switch can comprise a second down control switch 836-2 coupled between the filter capacitor 314 and the down control capacitor 808 or a second down control switch 832-2 coupled between the down control capacitor 808 and the equipotential node 516. The at least one second down diversion switch can comprise a second down diversion switch 838-2 coupled between the diversion terminal 708 and the down diversion capacitor 806 or a second down diversion switch 830-2 coupled between the down diversion capacitor 806 and the equipotential node 516. Although various switches are shown interconnected in a certain way, switch networks may be realized in alternative manners. For example, the first down diversion switch 822-1 and the second down diversion switch 830-2 can be merged into one switch and then controlled appropriately.

As shown on the left side of FIG. 8 with respect to the up current signal 428, the current-sampling capacitance circuitry 502 includes at least one first up control switch 812-1 or 820-1 coupled in series with the up control capacitor 804 between the up current source 412 and the equipotential node 516. The circuitry further includes at least one second up control switch 834-2 or 828-2 coupled in series with the up control capacitor 804 between the filter capacitor 314 and the equipotential node 516. The current-sampling capacitance circuitry 502 also includes at least one first up diversion switch 810-1 or 818-1 coupled in series with the up diversion capacitor 802 between the up current source 412 and the equipotential node 516. The circuitry further includes at least one second up diversion switch 826-2 or 840-2 coupled in series with the up diversion capacitor 802 between the diversion terminal 708 and the equipotential node 516.

FIG. 9 illustrates a particular configuration 900 for the components of the current-sampling capacitance circuitry 502 with the multiple switches in example states to institute the charge accumulation mode 606-1. The following switches are in an open state to prevent an appreciable current flow: switches 826-2, 828-2, 830-2, 832-2, 840-2, 838-2, 834-2, and 836-2. To implement the charge accumulation mode 606-1, the following switches are in a closed state to permit current flow: switches 810-1, 812-1, 814-1, 816-1, 818-1, 820-1, 822-1, and 824-1.

With these eight switches in a closed state, the up current signal 428 from the up current source 412 can be received by the up diversion capacitor 802 and the up control capacitor 804. Thus, the up diversion capacitor 802 and the up control capacitor 804 can accumulate and retain charge indicative of the up signal 416 generated by the phrase frequency detector 302 (of FIG. 4). Similarly, the down current signal 430 from the down current source 414 can be received by the down diversion capacitor 806 and the down control capacitor 808. Thus, the down diversion capacitor 806 and the down control capacitor 808 can accumulate and retain charge indicative of the down signal 418 generated by the phase frequency detector 302 (also of FIG. 4).

In example implementations, the charge can be scaled based on relative proportions between the diversion capacitors and the control capacitors. For instance, to produce an "(N−1)/N" to "1/N" ratio of charge scaling, the up diversion capacitor 802 and the down diversion capacitor 806 can be implemented to have "N" times the respective sizes of the up control capacitor 804 and the down control capacitor 808. For example, the up diversion capacitor 802 can be at least two times (e.g., 2-10 times) larger than the up control capacitor 804. Consequently, "(N−1)/N" of the charge 514 delivered by the charge pump 304 is accumulated by the up diversion capacitor 802 and the down diversion capacitor 806 as the second charge portion 722 (of FIG. 7). Similarly, "1/N" of the charge 514 delivered by the charge pump 304 is accumulated by the up control capacitor 804 and the down control capacitor 808 as the first charge portion 720. Thus, the charge manager 306 provides a mechanism for scaling, with respect to the filter capacitor 314, the charge 514 provided from the charge pump 304 by the up current signal 428 or the down current signal 430. As part of the charge scaling, the charge manager 306 can divide the charge 514 into the first charge portion 720 and the second charge portion 722.

In effect, a first amount of the first charge portion 720 relative to a second amount of the second charge portion 722 is proportional to a first size of the first capacitor (e.g., the up control capacitor 804 or the down control capacitor 808) relative to a second size of the second capacitor (e.g., the up diversion capacitor 802 or the down diversion capacitor 806, respectively). As described further with reference to FIG. 10, this charge scaling by the charge manager 306 enables a size of the filter capacitor 314 of the filter 308 to be scaled downward as compared to a size of the filter capacitor that would be employed to handle all of the charge 514 (e.g., of FIG. 5) issued by the charge pump 304. This is accomplished without reducing the current levels in the charge pump 304. Accordingly, the signal-to-noise ratio (SNR) in the charge pump 304 can be maintained and not appreciably increased, which is harmful to the performance of the phase-locked loop 130.

FIG. 10 illustrates a particular configuration 1000 for the components of the current-sampling capacitance circuitry 502 with the multiple switches in example states to institute the charge dispersion mode 606-2. The following switches are in an open state to prevent an appreciable current flow: switches 810-1, 812-1, 814-1, 816-1, 818-1, 820-1, 822-1, and 824-1. To implement the charge dispersion mode 606-2, the following switches are in a closed state to permit current flow: switches 826-2, 828-2, 830-2, 832-2, 840-2, 838-2, 834-2, and 836-2. With the former eight switches in an open state, no additional charge is received by the capacitors via the up current signal 428 or the down current signal 430.

Meanwhile, as depicted in FIG. 6, another current-sampling capacitance slice (not shown in FIG. 10) is configured in the charge accumulation mode 606-1 to receive charge from the up current source 412 and the down current source 414 so that no current signaling is missed.

With the latter eight switches in a closed state, the diversion capacitors and the control capacitors can disperse their stored charge for the charge dispersion mode 606-2. The two diversion capacitors divert the stored second charge portion to the diversion terminal 708. To do so, for the up diversion capacitor 802, the switches 840-2 and 826-2 provide a path for stored charge to flow to the diversion terminal 708 and away from the filter capacitor 314. For the down diversion capacitor 806, the switches 838-2 and 830-2 provide a path for stored charge to flow to the diversion terminal 708 and away from the filter capacitor 314.

The two control capacitors communicate the stored first charge portion to (e.g., route the stored first charge portion to or pull the stored charge portion from) the filter capacitor 314 to control a voltage level associated therewith. To do so, for the up control capacitor 804, the switches 828-2 and 834-2 provide a path for stored charge to be communicated to/applied to (e.g., routed to) the filter capacitor 314 and to affect (e.g., increase or decrease) the voltage level associated with the filter capacitor 314. For the down control capacitor 808, the switches 832-2 and 836-2 provide a path for stored charge to be communicated to/applied to (e.g., pulled from) the filter capacitor 314 to affect (e.g., increase or decrease) the voltage level associated with the filter capacitor 314.

Because the second charge portion is diverted away from the filter capacitor 314, the first charge portion that is communicated to the filter capacitor 314 contains less than all of the charge issued by the charge pump 304. Because less charge is communicated to the filter capacitor 314, a size of the filter capacitor 314 can be reduced as compared to a size of the filter capacitor that would be employed to handle all of the charge 514 (e.g., of FIG. 5) issued by the charge pump 304, while still achieving a given voltage level. For example, the diversion capacitors can be nine times bigger than the control capacitors. If so, the size of the filter capacitor 314 can be reduced to approximately 10% of the size it would otherwise have. Even with the addition of four capacitors, a significant area reduction for the phase-locked loop 130 is achievable because the filter capacitor 314 can be larger than the other capacitors by 2-3 orders of magnitude.

Using the current portion that is communicated to (e.g., routed to or pulled from) the filter 308, a voltage level associated with the filter capacitor 314 can be increased or decreased to control the voltage-controlled oscillator 310 as described next. In operation, the up current signal 428 from the up current source 412 is intended to increase a voltage level associated with the filter capacitor 314. The down current signal 430 from the down current source 414, on the other hand, is intended to decrease the voltage level associated with the filter capacitor 314. To correctly account for the different directions of the intended voltage changes, the tap at the down control capacitor 808 and at the up control capacitor 804 are positioned at different potential terminals.

As described above, the down control capacitor 808 has a higher potential terminal 808H and a lower potential terminal 808L, with the lower potential terminal 808L being closer to a ground potential than the higher potential terminal 808H. To enable the down control capacitor 808 to decrease the voltage level of the filter capacitor 314, the second down control switch 836-2 is coupled between the lower potential terminal 808L of the down control capacitor 808 and the filter capacitor 314. The up control capacitor 804 has a higher potential terminal 804H and a lower potential terminal 804L, with the lower potential terminal 804L being closer to the ground potential than the higher potential terminal 804H. To enable the up control capacitor 804 to increase the voltage level of the filter capacitor 314, the second up control switch 834-2 is coupled between the higher potential terminal 804H of the up control capacitor 804 and the filter capacitor 314.

Figure 11:
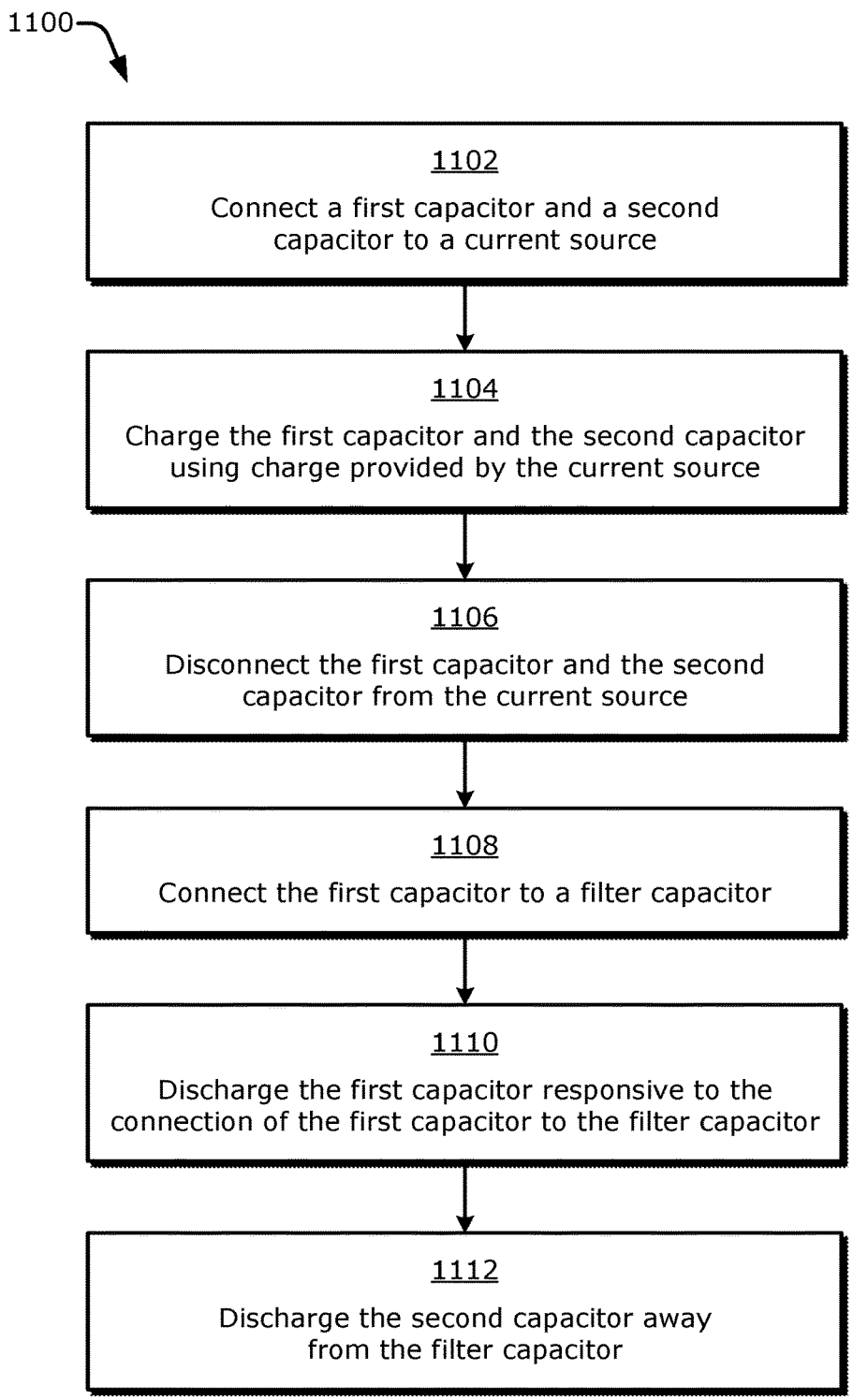
FIG. 11 is a flow diagram illustrating an example process for operating a phase-locked loop with charge scaling.

FIG. 11 is a flow diagram illustrating an example process 1100 for operating a phase-locked loop with charge scaling. The process 1100 is described in the form of a set of blocks 1102-1112 that specify operations that can be performed. However, operations are not necessarily limited to the order shown in FIG. 11 or described herein, for the operations may be implemented in alternative orders or in fully or partially overlapping manners. Operations represented by the illustrated blocks of the process 1100 may be performed by a phase-locked loop 130, such as at least partially by a charge manager 306. More specifically, the operations of the process 1100 may be performed by the switches and capacitors illustrated in FIGS. 8-10, in conjunction with other components, such as an up current source 412, a down current source 414, a switch controller 706. The operations below are described in terms of handling a down current signal 430 from the down current source 414, but the operations may also be implemented to handle an up current signal 428 from the up current source 412.

At block 1102, a first capacitor and a second capacitor are connected to a current source. For example, switches can connect a first capacitor, such as the down control capacitor 808, and a second capacitor, such as the down diversion capacitor 806, to a current source, such as the down current source 414. For instance, the switch controller 706 can cause the switches 814-1, 816-1, 822-1, and 824-1 to be closed using a switch control signal 724.

At block 1104, the first capacitor and the second capacitor are charged using charge provided by the current source. For example, the down control capacitor 808 and the down diversion capacitor 806 can charge using charge provided by the down current source 414 via the down current signal 430. The down control capacitor 808 and the down diversion capacitor 806 can therefore accumulate down-signal parts of the first charge portion 720 and the second charge portion 722, respectively, as part of a charge accumulation mode 606-1.

At block 1106, the first capacitor and the second capacitor are disconnected from the current source. For example, the switch controller 706 can cause the switches 814-1, 816-1, 822-1, and 824-1 to be in an open state using the switch control signal 724 to thereby disconnect the down control capacitor 808 and the down diversion capacitor 806 from the down current source 414.

At block 1108, the first capacitor is connected to a filter capacitor. For example, one or more switches can connect the down control capacitor 808 to a filter capacitor 314. For instance, the switch controller 706 can cause the switches 832-2 and 836-2 to be closed using the switch control signal 724.

At block 1110, the first capacitor is discharged responsive to the connecting of the first capacitor to the filter capacitor. For example, the charge accumulated by the down control capacitor 808 can be dispersed by being communicated to (e.g., pulled from) the filter capacitor 314 as part of a charge dispersion mode 606-2. By applying the accumulated charge to the filter capacitor 314, the down control capacitor 808 is changing (e.g., decreasing) a voltage level associated with the filter capacitor 314. In contrast, if the up control capacitor 804 is discharging, the charge accumulated thereon can be communicated to (e.g., routed to) the filter capacitor 314 as part of the charge dispersion mode 606-2 to change (e.g., increase) the voltage level associated with the filter capacitor 314.

At block 1112, the second capacitor is discharged away from the filter capacitor. For example, the charge accumulated by the down diversion capacitor 806 can be dispersed by being diverted away from the filter capacitor 314 and to the diversion terminal 708 as part of the charge dispersion mode 606-2. To do so, the switch controller 706 can cause the switches 830-2 and 838-2 to be in a closed state using the switch control signal 724.

Figure 12:
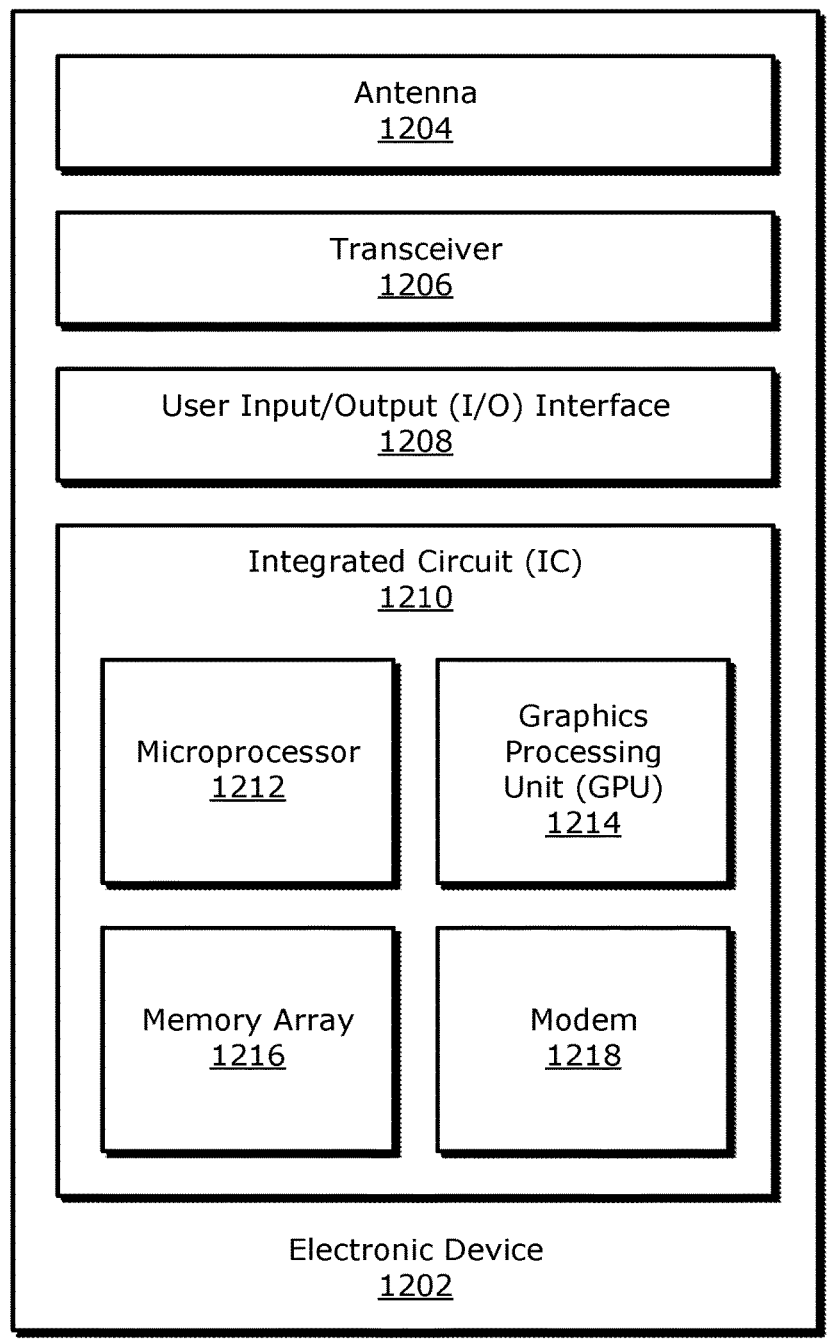
FIG. 12 illustrates an example electronic device that includes an integrated circuit in which a phase-locked loop with charge scaling can be implemented.

FIG. 12 illustrates an example electronic device 1202 that includes an integrated circuit (IC) 1210 having multiple cores. As shown, the electronic device 1202 includes an antenna 1204, a transceiver 1206, and a user input/output (I/O) interface 1208 in addition to the integrated circuit 1210. Illustrated examples of the integrated circuit 1210, or cores thereof, include a microprocessor 1212, a graphics processing unit (GPU) 1214, a memory array 1216, and a modem 1218. In one or more example implementations, a phase-locked loop 130 with charge scaling as described herein can be implemented by the transceiver 1206, by the integrated circuit 1210, and so forth so that a signal having a desired frequency can be synthesized using a scaled-down filter capacitor.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), or a power tool.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208. Examples of the user I/O interface 1208 include a keyboard, a mouse, a microphone, a touch-sensitive screen, a camera, an accelerometer, a haptic mechanism, a speaker, a display screen, or a projector. The transceiver 1206 can correspond to, for example, the wireless transceiver 120 (e.g., of FIGS. 1 and 2) that implements a phase-locked loop 130 having charge scaling.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual-related data for display, such as video data images. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or block-by-block. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1210 generally, may be termed cores or circuit blocks. Examples of cores or circuit blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
    a charge pump configured to generate a current signal;
    a filter including a filter capacitor; and
    a charge manager coupled between the charge pump and the filter, the charge manager including:
        current-sampling capacitance circuitry configured to:
            receive the current signal from the charge pump; and
            retain charge from the current signal to create stored charge, the stored charge including a first charge portion and a second charge portion; and a charge manager controller coupled to the current-sampling capacitance circuitry, the charge manager controller configured to:
cause the current-sampling capacitance circuitry to communicate the first charge portion to the filter capacitor; and
cause the current-sampling capacitance circuitry to divert the second charge portion away from the filter capacitor.

2. The integrated circuit of claim 1, wherein:
the current signal includes an up current signal and a down current signal; and
the current-sampling capacitance circuitry is configured to receive the up current signal and the down current signal from the charge pump.

3. The integrated circuit of claim 2, wherein:
the charge pump includes an up current source and a down current source;
the up current source is configured to provide, via the charge manager, at least a portion of the up current signal to the filter capacitor to increase a voltage level associated with the filter capacitor; and
the down current source is configured to provide, via the charge manager, at least a portion of the down current signal to the filter capacitor to decrease the voltage level associated with the filter capacitor.

4. The integrated circuit of claim 1, wherein:
the current-sampling capacitance circuitry comprises a current-sampling capacitance slice that includes at least one capacitor to retain the stored charge;
the charge manager controller comprises a mode controller configured to selectively institute a charge accumulation mode or a charge dispersion mode for the current-sampling capacitance slice;
the current-sampling capacitance slice is configured to accumulate, at the at least one capacitor, the charge received via the current signal from the charge pump for the charge accumulation mode; and
the current-sampling capacitance slice is configured to disperse, from the at least one capacitor, the stored charge for the charge dispersion mode.

5. The integrated circuit of claim 1, wherein:
the charge manager controller is configured to provide a mode control signal;
the current-sampling capacitance circuitry includes diversion circuitry and control circuitry;
the diversion circuitry includes:
a diversion capacitor network coupled to the charge pump and configured to receive at least a portion of the current signal; and
a diversion switch network coupled to the diversion capacitor network and to the charge manager controller and configured to receive the mode control signal; and
the control circuitry includes:
a control capacitor network coupled to the charge pump and configured to receive at least a portion of the current signal; and
a control switch network coupled to the control capacitor network and to the charge manager controller and configured to receive the mode control signal.

6. The integrated circuit of claim 5, wherein:
the diversion capacitor network is further coupled to a diversion terminal;
the control capacitor network is further coupled to the filter capacitor to control a voltage level associated with the filter capacitor; and if the mode control signal is indicative of a charge accumulation mode,
the diversion switch network is configured to disconnect the diversion capacitor network from the diversion terminal and to connect the diversion capacitor network to the charge pump based on the mode control signal; and
the control switch network is configured to disconnect the control capacitor network from the filter capacitor and to connect the control capacitor network to the charge pump based on the mode control signal, or
if the mode control signal is indicative of a charge dispersion mode,
the diversion switch network is configured to disconnect the diversion capacitor network from the charge pump and to connect the diversion capacitor network to the diversion terminal based on the mode control signal; and
the control switch network is configured to disconnect the control capacitor network from the charge pump and to connect the control capacitor network to the filter capacitor based on the mode control signal.

7. The integrated circuit of claim 6, wherein if the mode control signal is indicative of the charge dispersion mode:
the diversion capacitor network is configured to divert the second charge portion away from the filter capacitor and to the diversion terminal; and
the control capacitor network is configured to communicate the first charge portion to the filter capacitor.

8. The integrated circuit of claim 6, wherein:
the charge pump includes an up current source and a down current source;
the diversion capacitor network includes:
an up diversion capacitor switchably coupled to the up current source; and
a down diversion capacitor switchably coupled to the down current source; and
the control capacitor network includes:
an up control capacitor switchably coupled to the up current source; and
a down control capacitor switchably coupled to the down current source.

9. The integrated circuit of claim 8, wherein a first amount of charge retained by the up control capacitor relative to a second amount of charge retained by the up diversion capacitor is configured to be proportional to a first size of the up control capacitor relative to a second size of the up diversion capacitor.

10. An integrated circuit comprising:
a charge pump configured to generate a current signal that provides a charge;
a filter including a filter capacitor, the filter configured to provide a voltage signal to a voltage-controlled oscillator based on a voltage level associated with the filter capacitor; and
a charge manager coupled between the charge pump and the filter capacitor of the filter, the charge manager including:
control means for controlling the voltage level associated with the filter capacitor based on a first charge portion of the charge provided by the current signal; and
diversion means for diverting away from the filter capacitor a second charge portion of the charge provided by the current signal.

11. The integrated circuit of claim 10, wherein:
the control means comprises capacitive control means for retaining the first charge portion for a charge accumulation mode; and
the diversion means comprises capacitive diversion means for retaining the second charge portion for the charge accumulation mode.

12. The integrated circuit of claim 11, wherein:
the control means further comprises switch control means for disconnecting the capacitive control means from the charge pump and connecting the capacitive control means to the filter capacitor for a charge dispersion mode; and
the diversion means further comprises switch diversion means for disconnecting the capacitive diversion means from the charge pump and connecting the capacitive diversion means to a diversion terminal for the charge dispersion mode.

13. The integrated circuit of claim 10, wherein the charge manager comprises scaling means for scaling, with respect to the filter capacitor, the charge provided by the current signal from the charge pump.

14. The integrated circuit of claim 13, wherein the scaling means is configured to divide the charge provided by the current signal into the first charge portion and the second charge portion.

15. The integrated circuit of claim 10, wherein the filter comprises integration means for integrating the first charge portion using the filter capacitor.

16. A method for operating a phase-locked loop (PLL), the method comprising:
connecting a first capacitor and a second capacitor to a current source;
charging the first capacitor and the second capacitor using charge provided by the current source;
disconnecting the first capacitor and the second capacitor from the current source;
connecting the first capacitor to a filter capacitor;
discharging the first capacitor responsive to the connecting of the first capacitor to the filter capacitor; and
discharging the second capacitor away from the filter capacitor.

17. The method of claim 16, further comprising connecting the second capacitor to a diversion terminal, wherein:
the discharging of the second capacitor comprises discharging the second capacitor via the diversion terminal; and
the discharging of the first capacitor comprises changing a voltage level associated with the filter capacitor.

18. The method of claim 16, wherein:
the charging comprises:
charging the first capacitor using a first charge portion of the charge provided by the current source; and
charging the second capacitor using a second charge portion of the charge provided by the current source; and
a first amount of the first charge portion relative to a second amount of the second charge portion is proportional to a first size of the first capacitor relative to a second size of the second capacitor.

19. A phase-locked loop (PLL) comprising:
a charge pump including a down current source;
a filter including a filter capacitor; and
a charge manager coupled between the charge pump and the filter, the charge manager including:
a down control capacitor;
at least one first down control switch coupled in series with the down control capacitor between the down current source and an equipotential node;
at least one second down control switch coupled in series with the down control capacitor between the filter capacitor and the equipotential node;
a down diversion capacitor;
at least one first down diversion switch coupled in series with the down diversion capacitor between the down current source and the equipotential node; and
at least one second down diversion switch coupled in series with the down diversion capacitor between a diversion terminal and the equipotential node.

20. The phase-locked loop (PLL) of claim 19, wherein:
the at least one first down control switch comprises two first down control switches;
one of the two first down control switches is coupled between the down current source and the down control capacitor; and
another of the two first down control switches is coupled between the down control capacitor and the equipotential node.

21. The phase-locked loop (PLL) of claim 20, wherein:
the at least one first down diversion switch comprises two first down diversion switches;
one of the two first down diversion switches is coupled between the down current source and the down diversion capacitor; and
another of the two first down diversion switches is coupled between the down diversion capacitor and the equipotential node.

22. The phase-locked loop (PLL) of claim 19, wherein:
the at least one second down control switch comprises two second down control switches;
one of the two second down control switches is coupled between the filter capacitor and the down control capacitor; and
another of the two second down control switches is coupled between the down control capacitor and the equipotential node.

23. The phase-locked loop (PLL) of claim 22, wherein:
the at least one second down diversion switch comprises two second down diversion switches;
one of the two second down diversion switches is coupled between the diversion terminal and the down diversion capacitor; and
another of the two second down diversion switches is coupled between the down diversion capacitor and the equipotential node.

24. The phase-locked loop (PLL) of claim 23, wherein the equipotential node comprises a ground potential.

25. The phase-locked loop (PLL) of claim 23, wherein the diversion terminal is uncoupled from the filter capacitor.

26. The phase-locked loop (PLL) of claim 19, wherein:
the at least one first down control switch, if in a closed state, is configured to enable the down control capacitor to accumulate charge from the down current source; and
the at least one first down diversion switch, if in a closed state, is configured to enable the down diversion capacitor to accumulate charge from the down current source.

27. The phase-locked loop (PLL) of claim 19, wherein:
the at least one second down control switch, if in a closed state, is configured to enable the down control capacitor to disperse charge to affect a voltage level associated with the filter capacitor; and the at least one second down diversion switch, if in a closed state, is configured to enable the down diversion capacitor to disperse charge to the diversion terminal and away from the filter capacitor.

28. The phase-locked loop (PLL) of claim 19, wherein:
the charge pump further includes an up current source; and
the charge manager includes:
- an up control capacitor;
- at least one first up control switch coupled in series with the up control capacitor between the up current source and the equipotential node;
- at least one second up control switch coupled in series with the up control capacitor between the filter capacitor and the equipotential node;
- an up diversion capacitor;
- at least one first up diversion switch coupled in series with the up diversion capacitor between the up current source and the equipotential node; and
- at least one second up diversion switch coupled in series with the up diversion capacitor between the diversion terminal and the equipotential node.

29. The phase-locked loop (PLL) of claim 28, wherein:
the down control capacitor has a higher potential terminal and a lower potential terminal, the lower potential terminal is closer to a ground potential than the higher potential terminal, and a switch of the at least one second down control switch is coupled between the lower potential terminal of the down control capacitor and the filter; and
the up control capacitor has a higher potential terminal and a lower potential terminal, the lower potential terminal is closer to a ground potential than the higher potential terminal, and a switch of the at least one second up control switch is coupled between the higher potential terminal of the up control capacitor and the filter.

30. The phase-locked loop (PLL) of claim 19, wherein:
the filter includes an operational amplifier having a first input, a second input, and an output; and
the filter capacitor is coupled across the first input and the output of the operational amplifier.

\* \* \* \* \*